United States Patent
Godo et al.

(10) Patent No.: US 8,569,170 B2
(45) Date of Patent: Oct. 29, 2013

(54) MANUFACTURING METHOD OF SEMICONDUCTOR DEVICE COMPRISING SILICIDE LAYER WITH VARIED THICKNESS

(75) Inventors: Hiromichi Godo, Kanagawa (JP); Hajime Tokunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 72 days.

(21) Appl. No.: 12/636,811

(22) Filed: Dec. 14, 2009

(65) Prior Publication Data

US 2010/0093138 A1    Apr. 15, 2010

Related U.S. Application Data

(62) Division of application No. 11/599,322, filed on Nov. 15, 2006, now Pat. No. 7,659,580.

(30) Foreign Application Priority Data

Dec. 2, 2005    (JP) ................................. 2005-349574

(51) Int. Cl.
    *H01L 21/44* (2006.01)
(52) U.S. Cl.
    USPC .......... 438/682; 438/630; 438/649; 438/651; 438/664; 438/721; 257/E29.156; 257/E29.161; 257/E29.164; 257/E29.199; 257/E21.2; 257/E21.203; 257/E21.296; 257/E21.439
(58) Field of Classification Search
    CPC .................. H01L 29/66507; H01L 29/66515; H01L 29/665
    USPC ................. 438/630, 649, 651, 664, 682, 721; 257/E29.156, E29.161, E29.164, 257/E29.199, E21.2, E21.203, E21.296, 257/E21.439
    See application file for complete search history.

(56) References Cited

U.S. PATENT DOCUMENTS

| | | | |
|---|---|---|---|
| 4,804,438 A * | 2/1989 | Rhodes ......................... | 438/660 |
| 5,341,028 A | 8/1994 | Yamaguchi et al. | |

(Continued)

FOREIGN PATENT DOCUMENTS

| | | |
|---|---|---|
| JP | 02-237074 | 9/1990 |
| JP | 2003-224135 | 8/2003 |

(Continued)

OTHER PUBLICATIONS

Chinese Office Action (Chinese Application No. 200610064386.8; CN9237) dated Jun. 5, 2009 with English translation.

(Continued)

*Primary Examiner* — Matthew E Warren
*Assistant Examiner* — David Chen
(74) *Attorney, Agent, or Firm* — Nixon Peabody LLP; Jeffrey L. Costellia

(57) ABSTRACT

It is an object of the present invention to obtain a transistor with a high ON current including a silicide layer without increasing the number of steps. A semiconductor device comprising the transistor includes a first region in which a thickness is increased from an edge on a channel formation region side and a second region in which a thickness is more uniform than that of the first region. The first and second region are separated by a line which is perpendicular to a horizontal line and passes through a point where a line, which passes through the edge of the silicide layer and forms an angle θ (0°<θ<45°) with the horizontal line, intersects with an interface between the silicide layer and an impurity region, and the thickness of the second region to a thickness of a silicon film is 0.6 or more.

17 Claims, 31 Drawing Sheets

(56) References Cited

U.S. PATENT DOCUMENTS

| | | |
|---|---|---|
| 5,576,556 A | 11/1996 | Takemura et al. |
| 5,595,923 A * | 1/1997 | Zhang et al. ............ 438/162 |
| 6,882,018 B2 | 4/2005 | Ohtani et al. |
| 7,645,655 B2 | 1/2010 | Watanabe et al. |
| 7,968,396 B2 | 6/2011 | Watanabe et al. |
| 2001/0022369 A1 | 9/2001 | Fukuda et al. |
| 2002/0109196 A1 | 8/2002 | Fujisawa et al. |
| 2004/0175909 A1 | 9/2004 | Matsumoto |
| 2005/0142705 A1 | 6/2005 | Konuma et al. |
| 2005/0253178 A1 | 11/2005 | Yamaguchi et al. |
| 2006/0115948 A1 | 6/2006 | Tokunaga |
| 2007/0215869 A1 | 9/2007 | Moriya et al. |

FOREIGN PATENT DOCUMENTS

| | | |
|---|---|---|
| JP | 2004-221115 | 8/2004 |
| JP | 2004-289138 | 10/2004 |
| JP | 2006-344804 | 12/2006 |

OTHER PUBLICATIONS

Su et al., "Optimization of Series Resistance in Sub-0.2 µM SOI MOSFETs", IEDM 93: Technical Digest of International Electron Devices Meeting, 1993, pp. 723-726.

* cited by examiner

500nm

50nm

FIG. 7 P-channel transistor, low-concentration impurity region does not exist first etching second etching third etching

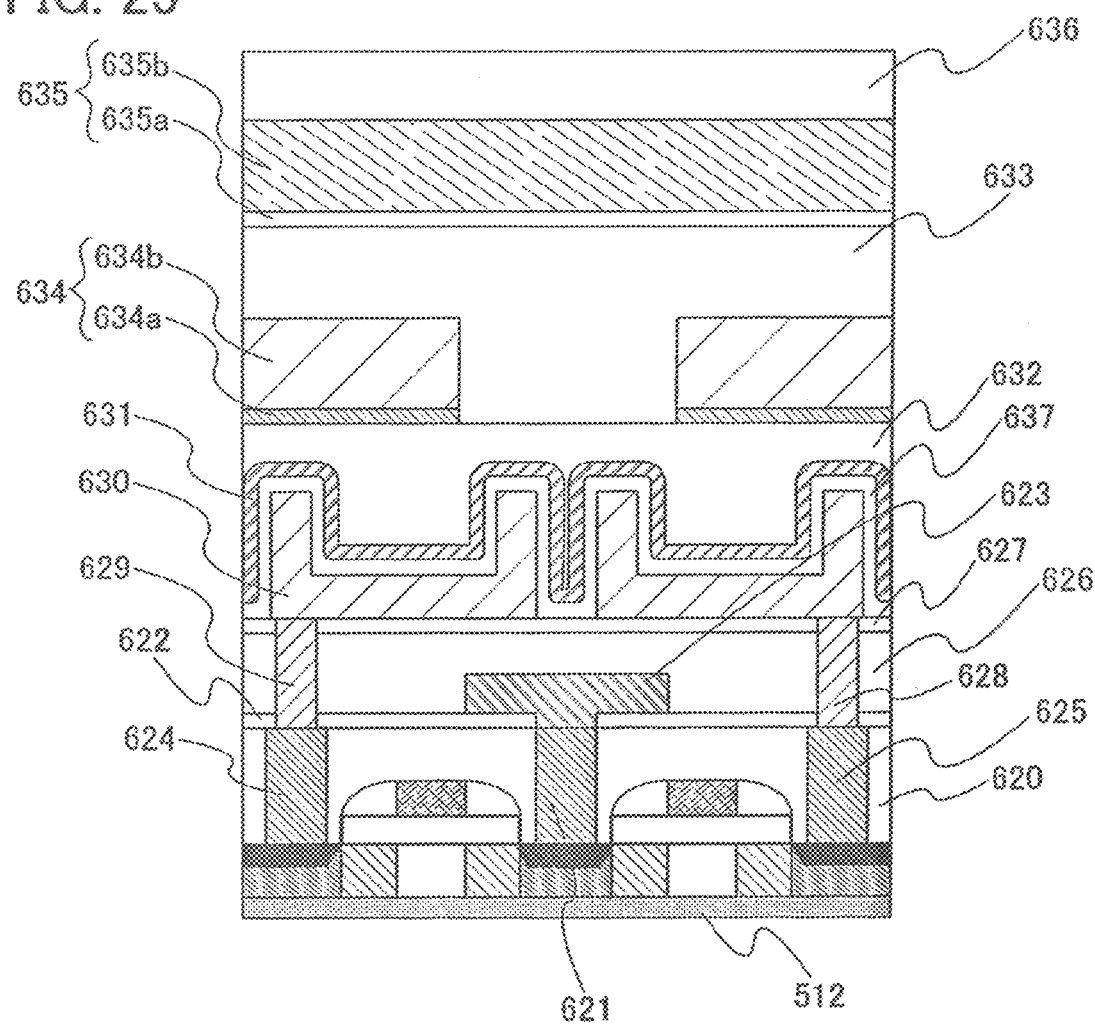

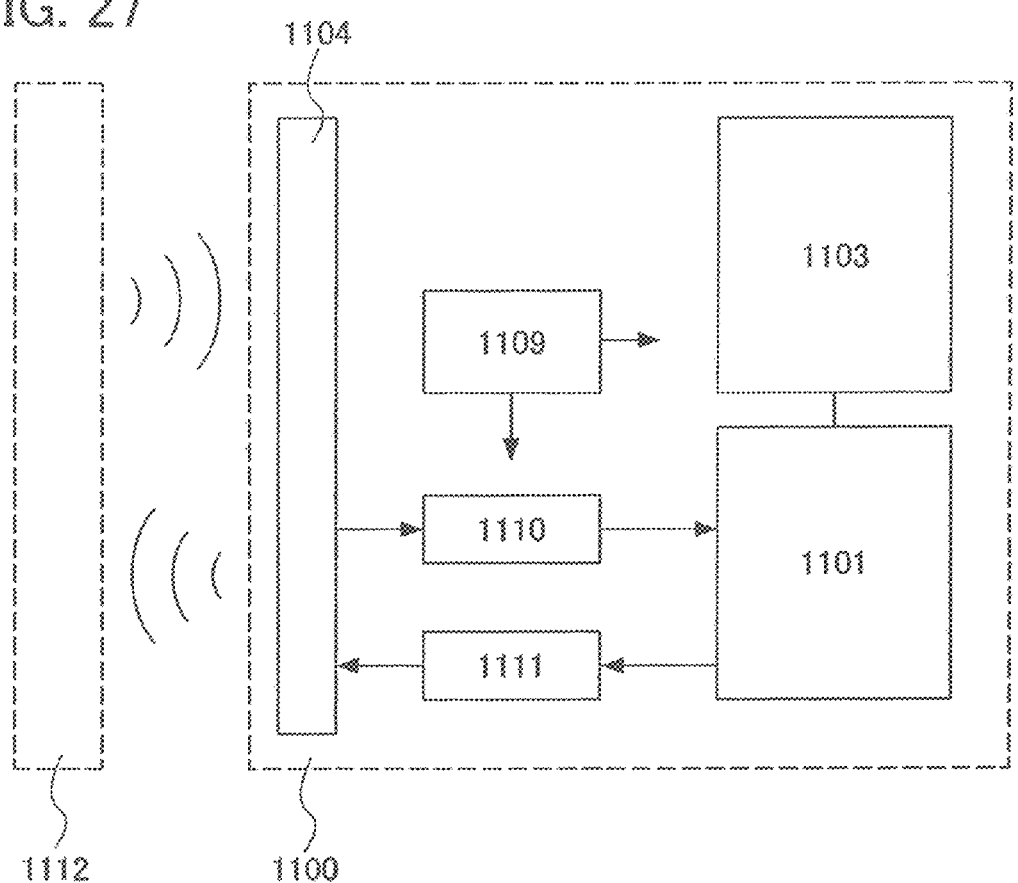

FIG. 28A
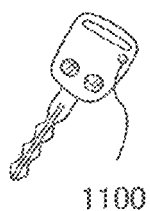
1100
FIG. 28B
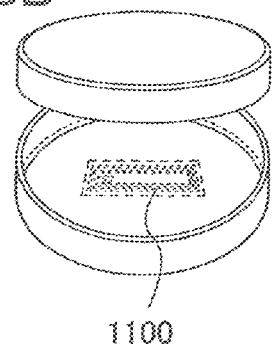
1100
FIG. 28C
1100
FIG. 28E
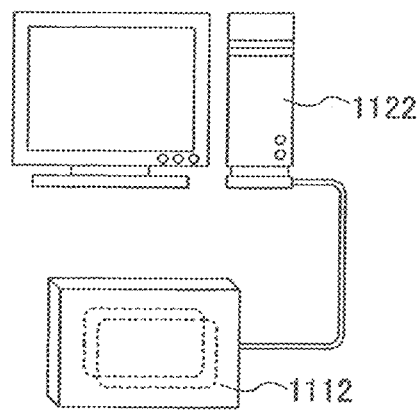
1122
1112
FIG. 28D
1100
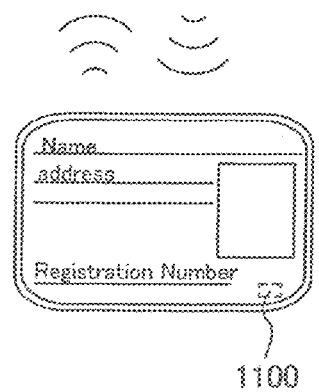
1100

MANUFACTURING METHOD OF SEMICONDUCTOR DEVICE COMPRISING SILICIDE LAYER WITH VARIED THICKNESS

BACKGROUND OF THE INVENTION

1. Field of the Invention

The present invention relates to a semiconductor device including a silicide layer and a manufacturing method thereof.

2. Description of the Related Art

In accordance with the reduction of an integrated circuit, a semiconductor device which forms an integrated circuit is required to have a lower contact resistance with a metal wiring and a lower resistance of an impurity region. Therefore, a technique in which a contact resistance or a resistance of an impurity region is reduced by forming a silicide layer in a semiconductor film is adopted in a semiconductor field (for example, Patent Document 1: Japanese Published Patent Application No. 2004-221115). When a resistance of a semiconductor film is reduced, an ON current of a semiconductor device is improved and a semiconductor device with a high characteristic can be manufactured.

On the other hand, when a silicide layer of a semiconductor is thickened, a sheet resistance is reduced; accordingly, it is predicted that an ON current becomes higher. However, it is reported in Non-Patent Document 1 (Non-Patent Document 1: OPTIMIZATION OF SERIES RESISTANCE IN SUB-0.2 μm SOI MOSFETs: Lisa T. Su et al., IEDM93, pp. 723-726, 1993) that when a silicide layer is actually formed to be thick, a resistance is increased and an ON current is decreased.

SUMMARY OF THE INVENTION

It is a first object of the present invention to obtain a semiconductor device including a silicide layer, with a high ON current.

It is a second object of the present invention to obtain a semiconductor device with a high ON current, with reduced sheet resistance.

In order to increase an ON current, there is a method of increasing an activation rate of an impurity region by setting the temperature in heat treatment to be high in activation of the impurity region, as well as a method of providing a silicide layer. Alternatively, there is also a method in which a semiconductor film is heated or irradiated with a laser beam to be annealed so that crystallinity of the semiconductor film is improved.

However, in these methods, one heat treatment step is added, and an apparatus for the heat treatment is additionally required; accordingly, there has been a problem in increasing manufacturing cost. In addition, in the case where a substrate with low heat resistance such as a glass substrate is used as a substrate, the substrate might be shrunk by the high-temperature heat treatment. Therefore, usable substrates have been limited to a substrate with high heat resistance, and there has been a problem of reducing the selection freedom of the substrate.

Thus, it is a third object of the present invention to obtain a semiconductor device with a high ON current, without increasing the number of steps of the present invention. It is another object of the present invention to heighten the ON current without the limitation of a substrate.

One feature of the present invention is a semiconductor device which includes a silicon film including a channel formation region, an impurity region and a silicide layer; a gate insulating film; a gate electrode; and a wiring electrically connected to the impurity region via the silicide layer, in which the silicide layer includes, in a cross section thereof, a first region where the thickness is increased from an edge on a channel formation region side and a second region where the thickness is more uniform than that of the first region. Further, when the first region and the second region are separated by a line which is perpendicular to a horizontal line and a point where the perpendicular line intersects with an interface between the silicide layer and the impurity region is assumed as a first point, a straight line which passes through the first point and the edge of the silicide layer forms an angle θ (0°<θ<45°) with the horizontal line, and the thickness of the second region to the thickness of the silicon film is 0.6 or more.

Another feature of the present invention is a semiconductor device which includes a silicon film including a channel formation region, an impurity region and a silicide layer; a gate insulating film; a gate electrode; and a wiring electrically connected to the impurity region via the silicide layer, in which the silicide layer includes, in a cross section thereof, a first region where a thickness is increased from an edge on a channel formation region side and a second region having a thickness equal to a thickness of the silicon film; and when the first region and the second region are separated by a line which is perpendicular to a horizontal line and a point where the perpendicular line intersects with a bottom surface of the silicon film is assumed as a first point, a straight line which passes through the first point and the edge forms an angle θ (0°<θ<45°) with the horizontal line.

Still another feature of the present invention is the above-described semiconductor device in which a silicon substrate is substituted for the silicon film.

Still another feature of the present invention is to control a film formation condition so that the thickness of a metal film is purposely ununiform, in forming the metal film for forming a silicide layer. Accordingly, the first region where the thickness of the silicide layer is increased can be increased in size, or the first region can be lengthened in a channel length direction.

Description is made with reference to FIGS. 1A and 1B. FIG. 1A shows a cross section of a transistor, and FIG. 1B shows an enlarged portion surrounded by a dashed line of FIG. 1A. A silicon film or a silicon substrate includes a region 11, an impurity region 12 and a silicide layer 13. The region 11 may, as long as it includes a channel formation region, include a low-concentration impurity region or a high-concentration impurity region in contact with the impurity region 12. A wiring 16 provided by etching an interlayer insulating film is connected to the silicide layer 13. The silicide layer 13 includes a first region 13a and a second region 13b as shown in FIG. 1B. The thickness of the first region 13a is increased from an edge A on a channel formation region side. The thickness of the second region 13b is more uniform than that of the first region 13a.

Over the silicon film or the silicon substrate, a gate insulating film 14 and a gate electrode 15 over the gate insulating film 14 are formed. The shape and width of the gate insulating film 14 are not limited to those shown in FIGS. 1A and 1B, and any shape and width may be employed. For example, the gate insulating film 14 may have a tapered shape and a sloping side. In addition, the gate electrode 15 may have a single layer or stacked layers without the limitation to FIGS. 1A and 1B, and a cross section thereof may be a tapered shape. That is, the present invention is not affected by the gate electrode 15 and the gate insulating film 14.

The first region 13a and the second region 13b are separated by a line which passes through a point B and is perpendicular to a horizontal line. Further, the point B is on an interface between the silicide layer 13 and the impurity region 12. A straight line which passes through the point B and an edge A forms an angle θ with the horizontal line. When the angle θ satisfies the condition: $0°<θ<45°$, the thickness of the silicon film is denoted by d2, and the thickness of the second region 13b of the silicide layer is denoted by d1, the following is satisfied: $d1/d2 \geq 0.6$. Note that when $d1/d2=1.0$, the point B is positioned on a bottom surface of the silicon film or the silicon substrate.

In accordance with the present invention, a semiconductor device with a high ON current can be obtained by controlling the shape of a silicide layer. In addition, a semiconductor device with a high ON current can be obtained with reduced sheet resistance. Further, an ON current can be heightened without increasing the number of manufacturing steps of a semiconductor device. Accordingly, a high ON current can be obtained with a maintained manufacturing cost of a conventional semiconductor device. In addition, since high-temperature heat treatment is not required to obtain a high ON current, a substrate with low heat resistance can also be used; accordingly, a substrate can be employed without the limitation on heat resistance.

BRIEF DESCRIPTION OF DRAWINGS

In the accompanying drawings:

FIG. 25 shows a manufacturing method of a semiconductor device of the present invention (Embodiment Mode 6);

FIG. 27 shows a semiconductor device of the present invention (Embodiment Mode 7);

FIGS. 28A to 28E show ways to use a semiconductor device of the present invention (Embodiment Mode 7);

DETAILED DESCRIPTION OF THE INVENTION

Embodiment modes of the present invention will be described hereinafter. Note that it is easily understood by those skilled in the art that the present invention can be implemented in many various modes, and various changes may be made in forms and details without departing from the spirit and the scope of the invention. Therefore, the invention should not be limited to the descriptions of the embodiment modes below.

Embodiment Mode 1

In the present invention, it was analyzed that how the thickness and shape of silicide affected on an ON current in a transistor including a silicide layer.

Figure 1A:
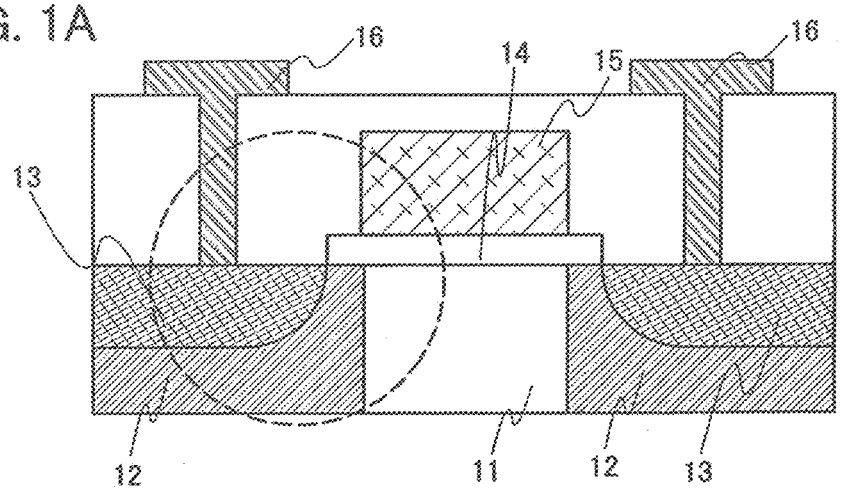
FIGS. 1A and 1B are cross-sectional views of a semiconductor device of the present invention.
Figure 2A:
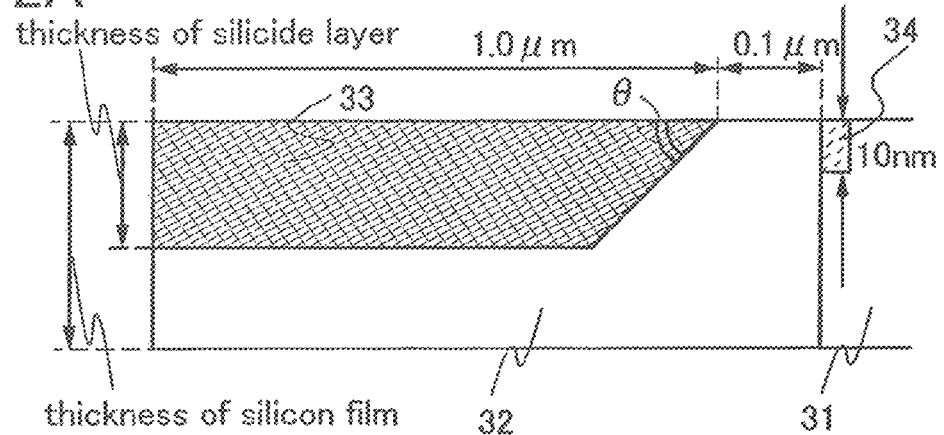
FIGS. 2A and 2B are cross-sectional views of element structures assumed in an analysis (Embodiment Mode 1)
Figure 2B:
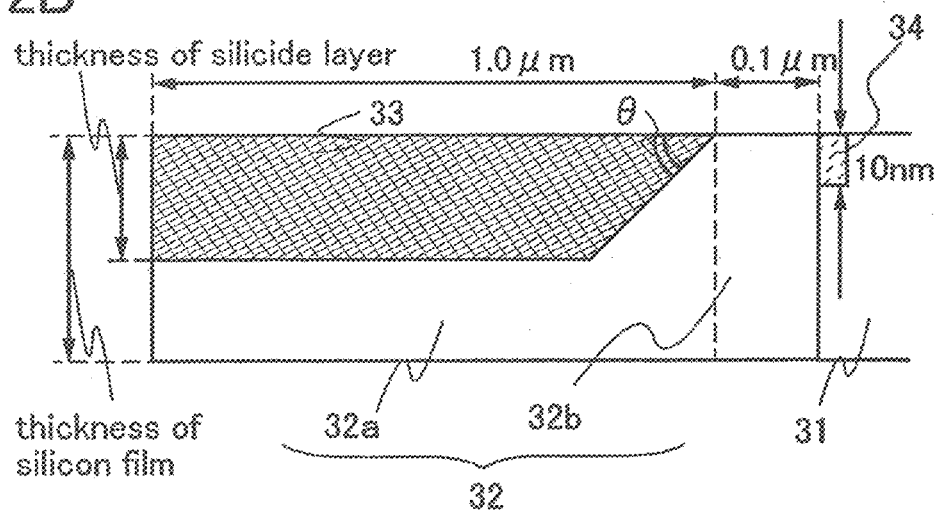

FIGS. 2A and 2B are schematic views showing a part of a silicon film which is a semiconductor film of a top-gate transistor, and also showing a structure of an element assumed in this analysis. FIGS. 2A and 2B schematically show the part of the silicon film surrounded by a dashed line of FIG. 1A. The element used in the analysis may be any of a thin film transistor (TFT), a transistor formed directly over a silicon substrate, and a transistor formed over a silicon-on-insulator (SOI) substrate such as a separation by implanted oxygen (SIMOX) substrate.

FIG. 2A shows an element structure in the case where a low-concentration impurity region does not exist between a silicide layer 33 and a region 31. FIG. 2B shows an element structure in the case where a low-concentration impurity region exists between the silicide layer 33 and the region 31. Both the element structures include the region 31, an impurity region 32 and the silicide layer 33. The region 31 is a region over which a gate electrode is disposed with a gate insulating film interposed therebetween, and includes at least a channel formation region. As well as the channel formation region, in FIG. 2A, the region 31 may include an impurity region which is in contact with the impurity region 32; in FIG. 2B, the region 31 may include a low-concentration impurity region which is in contact with a low-concentration impurity region 32b. It is assumed that carriers flow toward an electrode 34 from the silicide layer 33 and the impurity region 32. Accordingly, the impurity region 32 or a high-concentration impurity region 32a serves as a source region.

In FIGS. 2A and 2B, the electrode 34 was assumed in the upper portion of the region 31, instead of assuming an inversion layer. Since the region 31 is a portion having the gate electrode thereover, when the transistor is on, carriers flow on a surface of a silicon film which is below the gate electrode. A path of the carriers was assumed as the electrode 34. Because the thickness of a path which carriers flow through, a so-called an inversion layer, in a transistor is generally about 10 nm or less, the thickness of the electrode 34 was assumed to be 10 nm. The electrode 34 was applied with 5 V in the case of an N-channel transistor, and −5 V in the case of a P-channel transistor.

The length of a top surface of the silicide layer 33 in a channel length direction was set as 1.0 μm, and the length of a top surface of the impurity region between the silicide layer 33 and the region 31 in a channel length direction was set at 0.1 μm. In addition, the thickness of the silicon film included the thickness of the silicide layer.

Several values were adopted as shown in Table 1, for the thickness of the silicon film, the thickness ratio of the silicide layer to the silicon film, the carrier concentration, and the contact resistance Rc between the silicon film and the silicide layer. The conductivities of both an N-type and a P-type were assumed.

TABLE 1

| | |
|---|---|
| thickness of silicon film [nm] | 50, 100, 150 |
| thickness ratio of silicide layer to silicon film | 0.4, 0.6, 0.8, 1.0 |
| conductivity | N-type, P-type |
| contact resistance Rc between silicon film and silicide layer [Ω·cm$^2$] | 5E−8, 1E−7, 5E−7 |
| low-concentration impurity region | exist, not exist |
| carrier concentration [cm$^{-3}$] | low-concentration impurity region (1E17, 1E18) high-concentration impurity region (1E20) |
| θ [°] | 15, 30, 45, 60, 75 |

In the case of FIG. 2A where the low-concentration impurity region did not exist between the silicide layer 33 and the region 31, the carrier concentration of the impurity region 32 was set at $1\times10^{20}$ cm$^{-3}$. In the case of FIG. 2B where the low-concentration impurity region 32b existed between the silicide layer 33 and the region 31, the carrier concentration of the low-concentration impurity region 32b was set at $1\times10^{17}$ cm$^{-3}$ or $1\times10^{18}$ cm$^{-3}$, and the carrier concentration of the high-concentration impurity region 32a was set at $1\times10^{20}$ cm$^{-3}$. In addition, the length of the low-concentration impurity region 32b in a channel length direction was set at 0.1 μm.

In all the conditions, a relation between an ON current and an angle θ of an edge portion on the channel formation region side in the silicide layer 33 (hereinafter referred to as an angle θ) was analyzed by calculation. This analysis was conducted by using Dessis manufactured by Synopsys Inc., and each ON current when the angle θ is 15°, 30°, 45°, 60°, and 75° was calculated.

Although the contact resistance varies depending on the kind of silicide, a total of three values including an assumable minimum value, an assumable maximum value and a value therebetween were assumed among values of a contact resistance between silicon and silicide which are used in a semiconductor field.

Figure 3A:
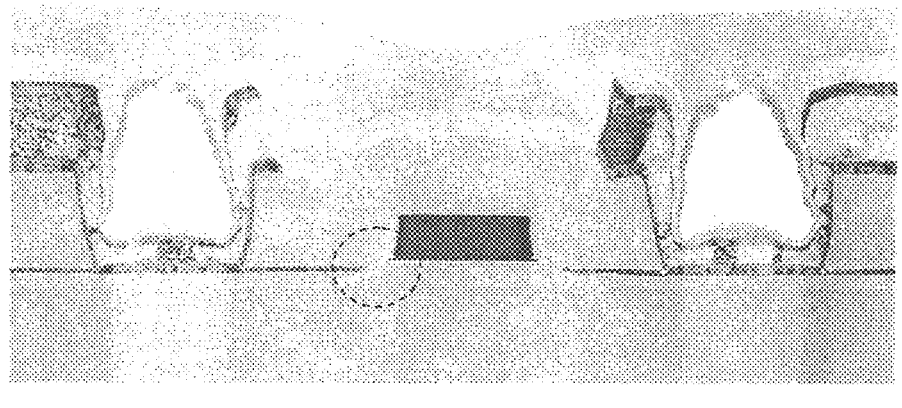
FIGS. 3A and 3B are TEM photographs of a cross section of a silicide layer (Embodiment Mode 1)
Figure 3B:
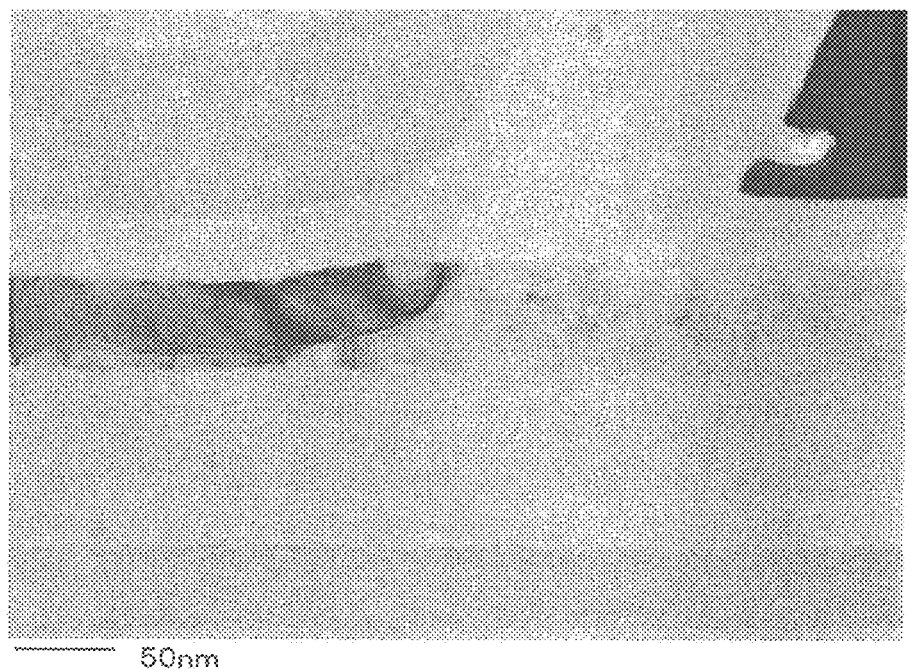

FIGS. 3A and 3B are TEM photographs of a cross section of a silicide layer. FIG. 3A is a cross-sectional photograph of a top-gate transistor, and FIG. 3B is an enlarged photograph showing a region surrounded by a dashed line in FIG. 3A. It can be seen that the structure of the transistor is similar to that of FIGS. 1A and 1B and is a top-gate type and that a black silicide layer is formed on a surface of an impurity region. In a cross section of an actual silicide layer, the thickness of the silicide layer is gradually increased from an edge on a channel formation region side and the silicide layer has a shape with curvature, as show in the photographs of FIGS. 3A and 3B. However, for simplicity, it is assumed in the calculation that the cross section of the silicide layer does not have curvature and the silicide layer has a side surface which forms an angle θ with a horizontal line.

Figure 4:
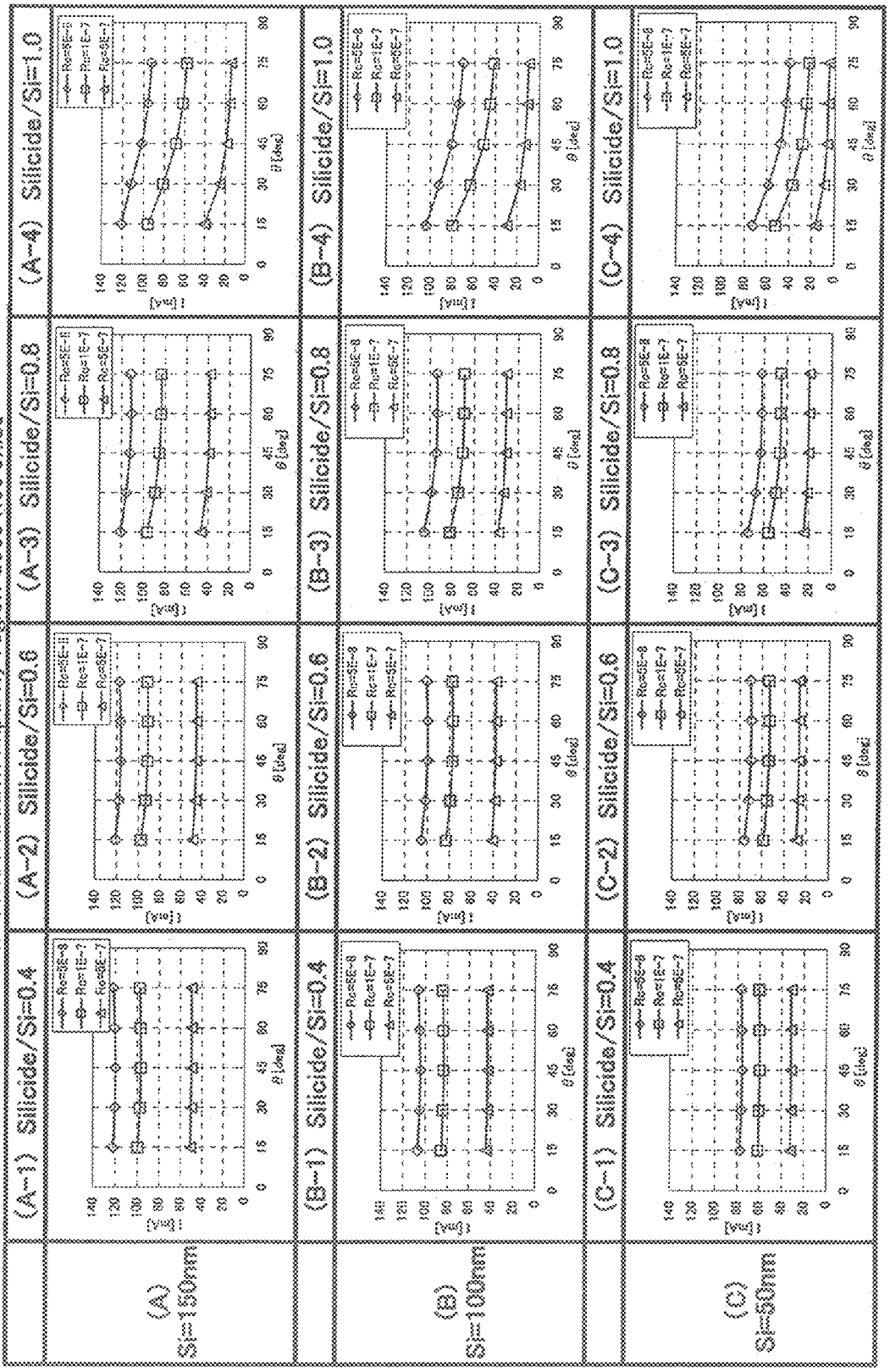
FIG. 4 shows evaluation results of N-channel transistors (Embodiment Mode 1)
Figure 5:
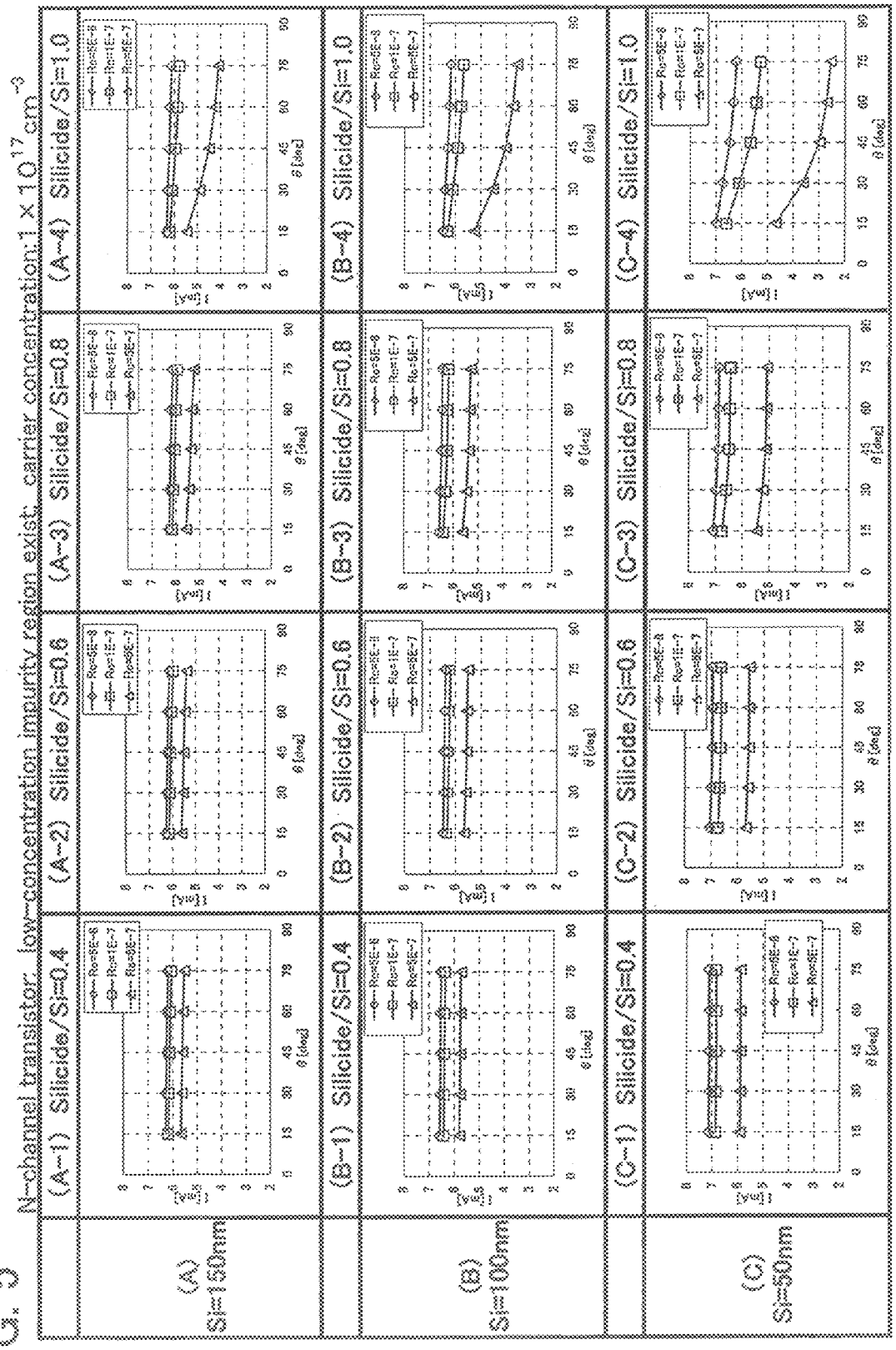
FIG. 5 shows evaluation results of N-channel transistors (Embodiment Mode 1)
Figure 6:
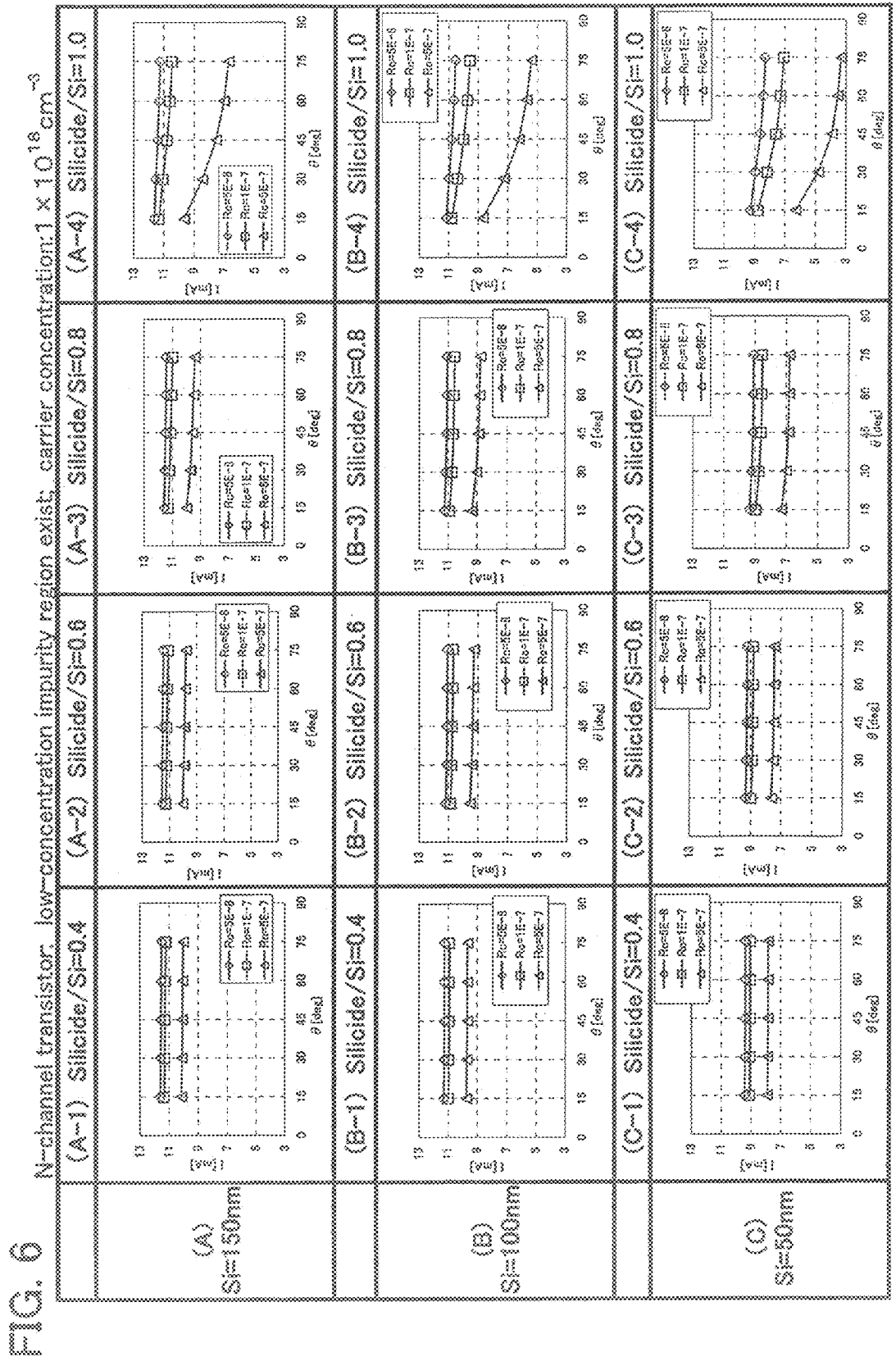
FIG. 6 shows evaluation results of N-channel transistors (Embodiment Mode 1)
Figure 7:
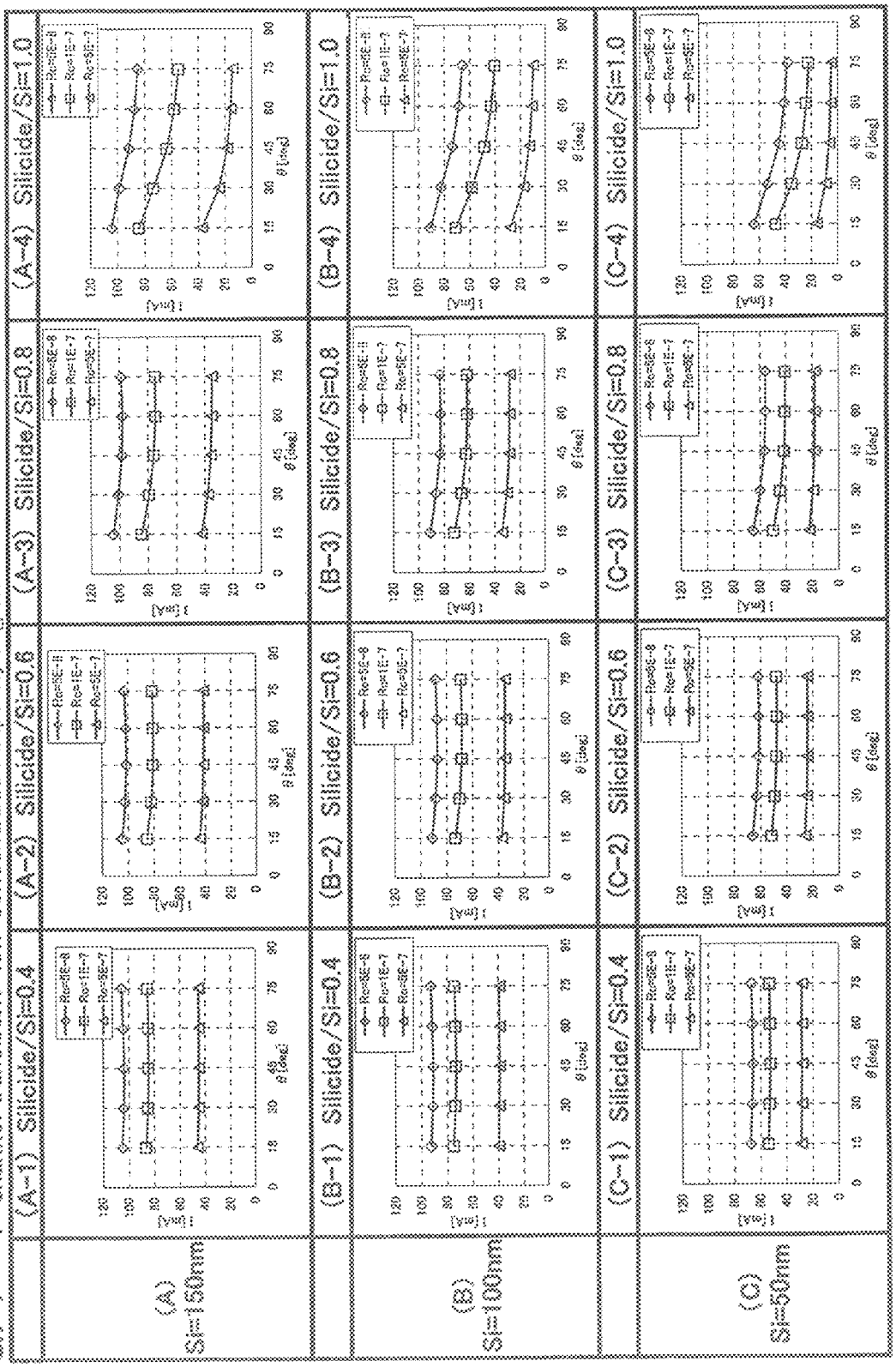
FIG. 7 shows evaluation results of P-channel transistors (Embodiment Mode 1)
Figure 8:
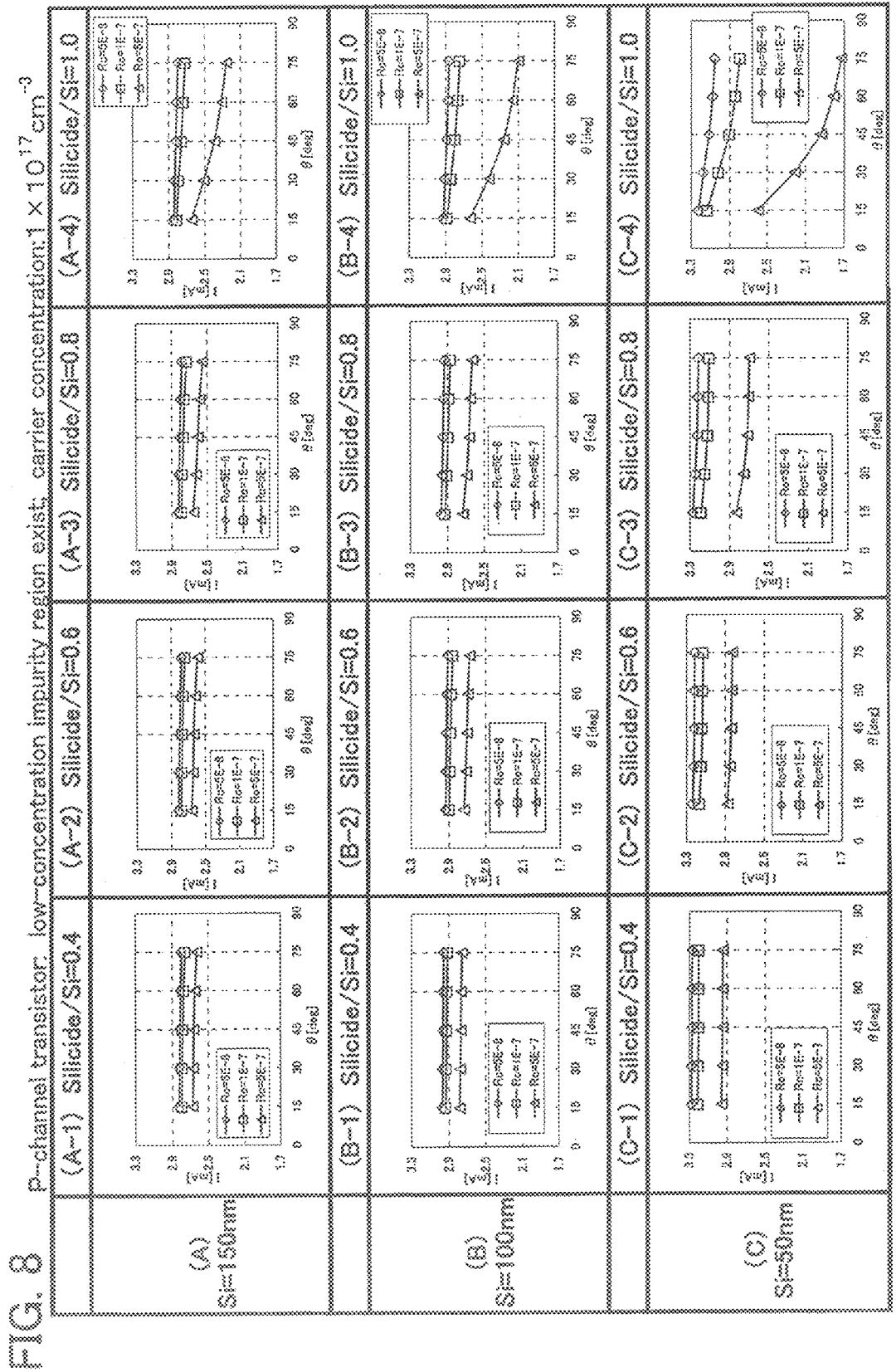
FIG. 8 shows evaluation results of P-channel transistors (Embodiment Mode 1)
Figure 9:
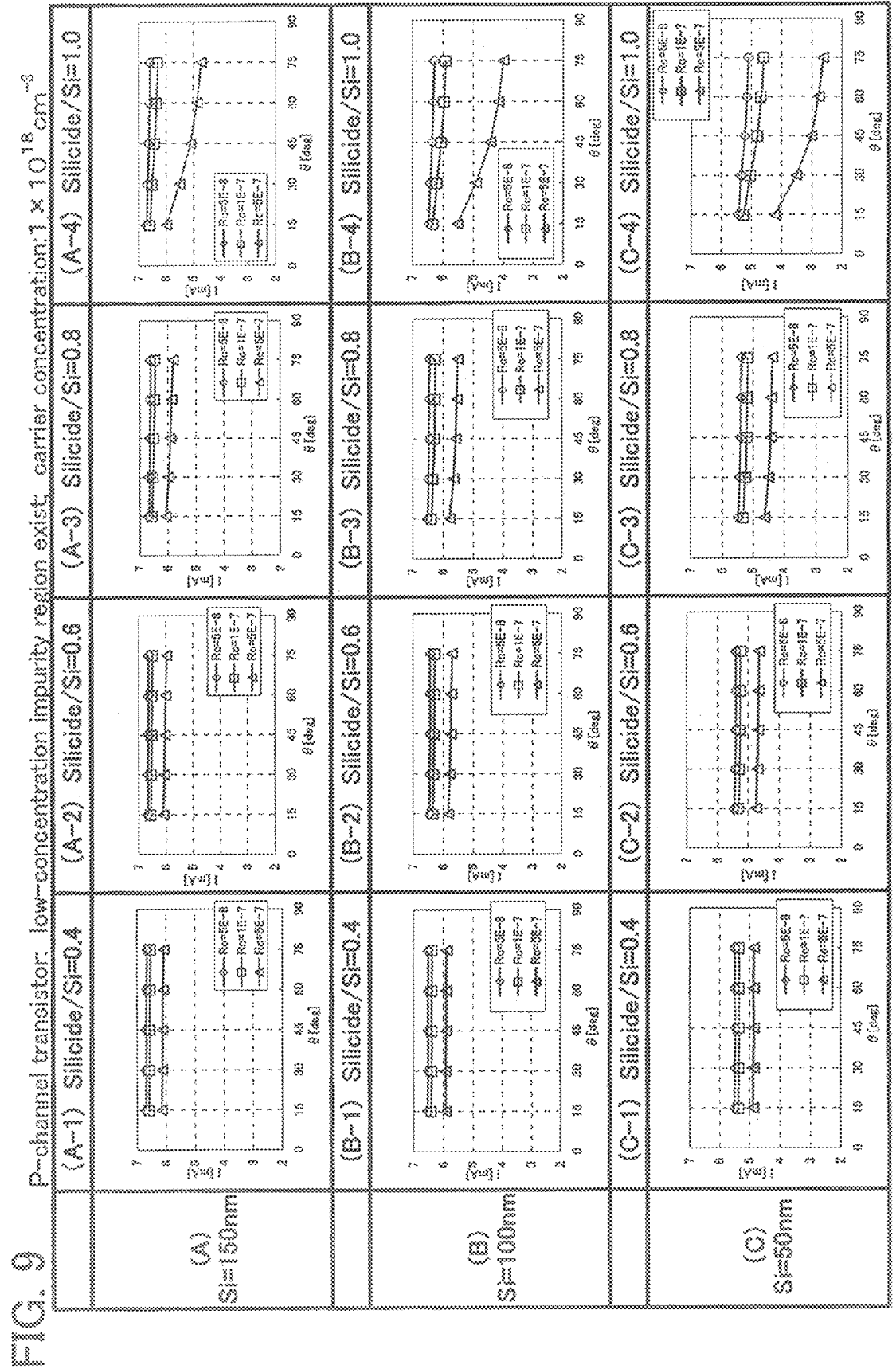
FIG. 9 shows evaluation results of P-channel transistors (Embodiment Mode 1)

Analysis results by the computer are shown in FIGS. 4 to 9. FIGS. 4 to 6 show the results in the case of N-channel transistors, and FIGS. 7 to 9 show the results in the case of P-channel transistors. The horizontal axis indicates an angle θ in the edge portion on the channel formation region side of the silicide layer 33, and the vertical axis indicates a value of an so-called ON current, which is a current flowing from the silicide layer 33 and the impurity region 32 to the electrode 34.

Each (A) of FIGS. 4 to 9 shows the analysis result when the silicon film thickness is 150 nm; each (B) of FIGS. 4 to 9 shows the analysis result when the silicon film thickness is 100 nm; and each (C) of FIGS. 4 to 9 shows the evaluation result when the silicon film thickness is 50 nm. The results in each silicon thickness are plotted separately by the film-thickness ratios of the silicide layer to the silicon film (hereinafter referred to as a film-thickness ratio).

FIGS. 4 and 7 each have an element structure shown in FIG. 2A and are results in the case where a low-concentration impurity region does not exist between the region 31 and the silicide layer 33. In each of FIGS. 4 and 7, an ON current is observed while increasing the film-thickness ratio with a fixed silicon film thickness. Then, it is found that when the film-thickness ratio is 0.4 in (A-1), (B-1) and (C-1) of FIG. 4, the ON current does not so much depend on the angle θ, whereas, as the film-thickness ratio is increased, the ON current comes to depend on the angle θ gradually.

In (A) of FIG. 4 where the silicon film thickness is 150 nm, when ON currents in each film-thickness ratio of (A-1) to (A-4) of FIG. 4 are compared at the condition where the contact resistance Rc is $5\times10^{-8}$ Ω·cm$^2$ and the angle θ is 15°, the values of the ON currents are almost the same. However, with the increased film-thickness ratio, the ON current comes to depend on the angle θ and the ON current is decreased. This tendency is common to all the graphs of FIGS. 4 to 7.

FIGS. 5, 6, 8, and 9 each have a structure shown in FIG. 2B and are results in the case where the low-concentration impurity region 32b has a carrier concentration of $1\times10^{17}$ cm$^{-3}$ or $1\times10^{18}$ cm$^{-3}$. Similarly to FIGS. 4 and 7, FIGS. 5, 6, 8, and 9 have a tendency in which the ON current comes to depend on the angle θ as the film-thickness ratio is increased. In addition, at the film-thickness ratios with the same silicon film thickness and the angle θ of 15°, the values of the ON currents are almost the same, while there is a tendency that the ON current comes to depend on the angle θ and the ON current is decreased as the film-thickness ratio is increased.

Further, in FIGS. 4 to 9, at the same silicon film thickness and a contact resistance Rc of $5\times10^{-7}$ $\Omega \cdot cm^2$, there is also a tendency that the value of the ON current is decreased from the value at an angle θ of 15° as the film-thickness ratio is increased.

Accordingly, it was found that although a correlation between the angle θ and the ON current did not apparently appear at a film-thickness ratio of 0.4, of the silicide layer to the silicon film, the ON current was decreased when the angle θ was increased at a film-thickness ratio of 0.6 or more. This is also mentioned in the report of Non-Patent Document 1 which has been cited in Field of the Invention. When the film thickness of a silicide layer is increased, a sheet resistance is decreased; accordingly, it is predicted that an ON current is increased. However, in practice, the result that the ON current was decreased was obtained.

Figure 10:
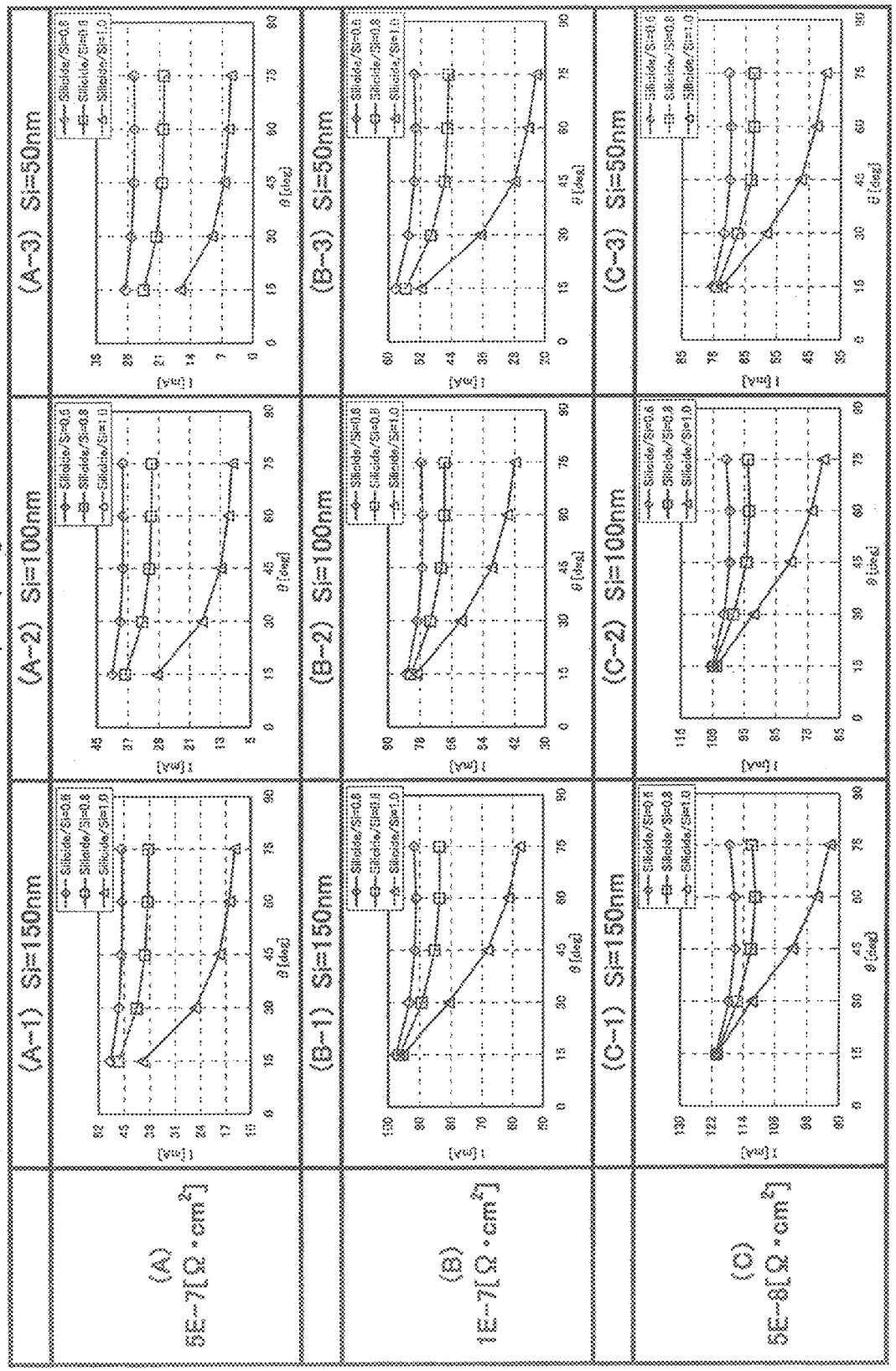
FIG. 10 shows evaluation results of N-channel transistors (Embodiment Mode 1)
Figure 11:
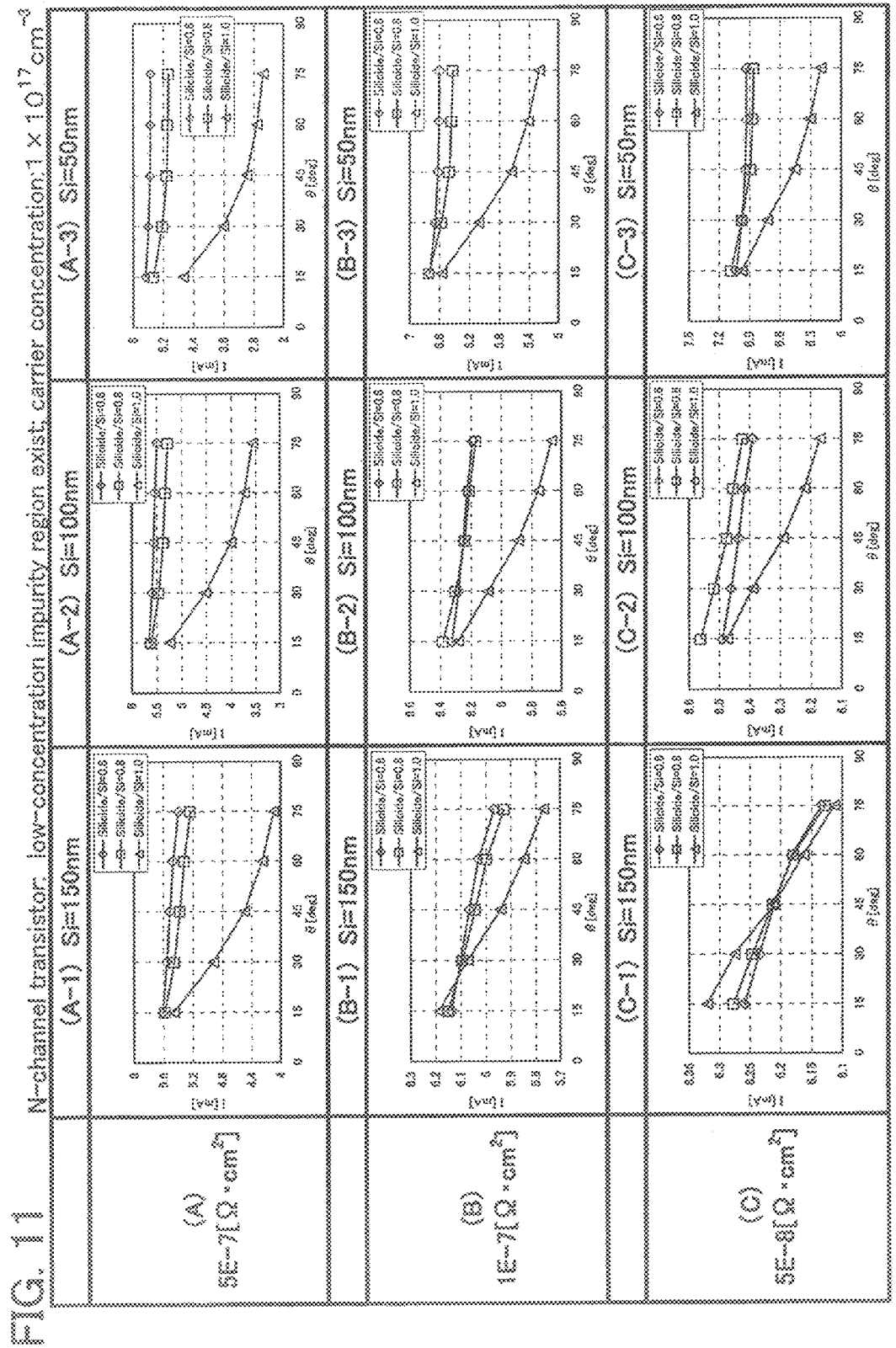
FIG. 11 shows evaluation results of N-channel transistors (Embodiment Mode 1)
Figure 12:
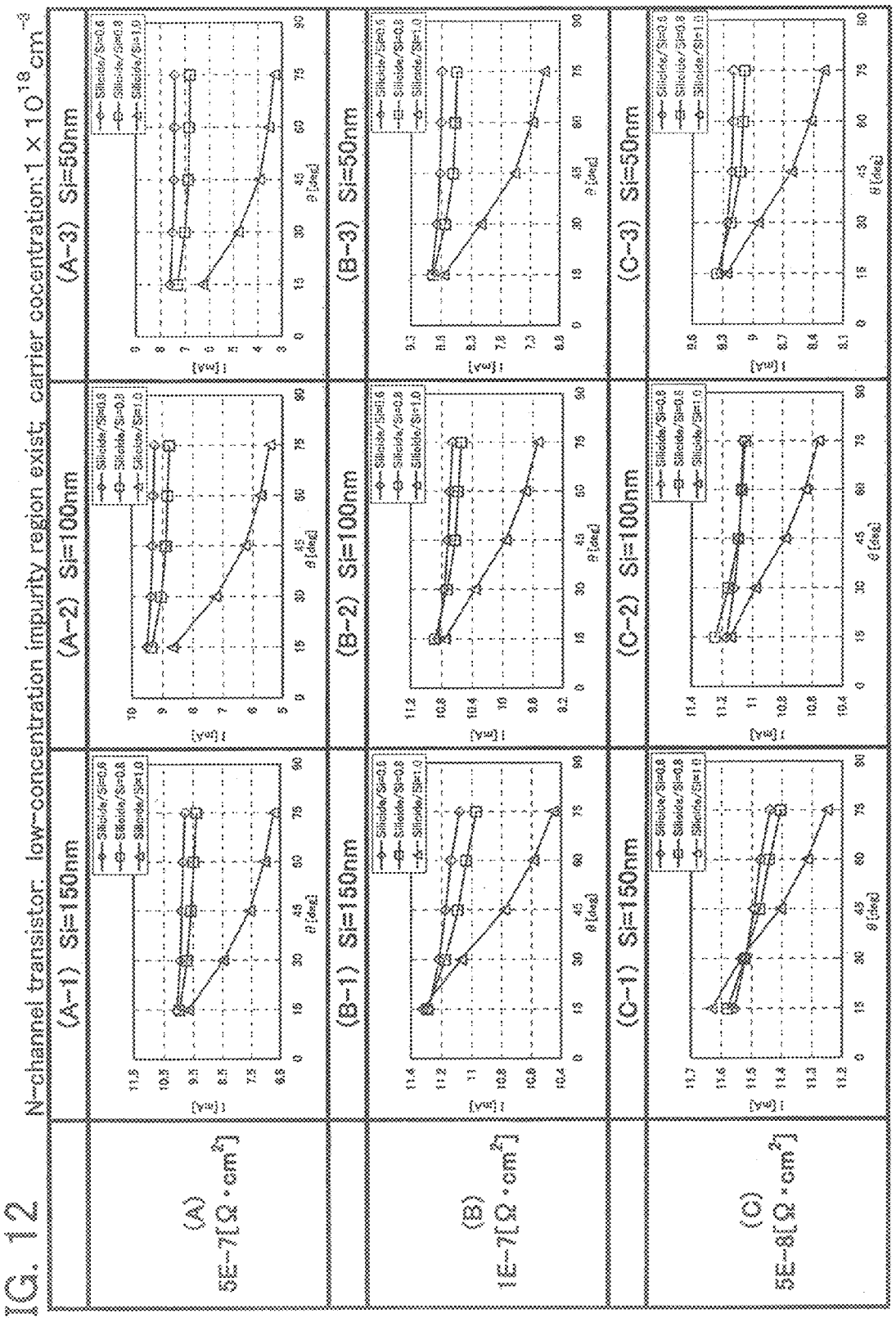
FIG. 12 shows evaluation results of N-channel transistors (Embodiment Mode 1)
Figure 13:
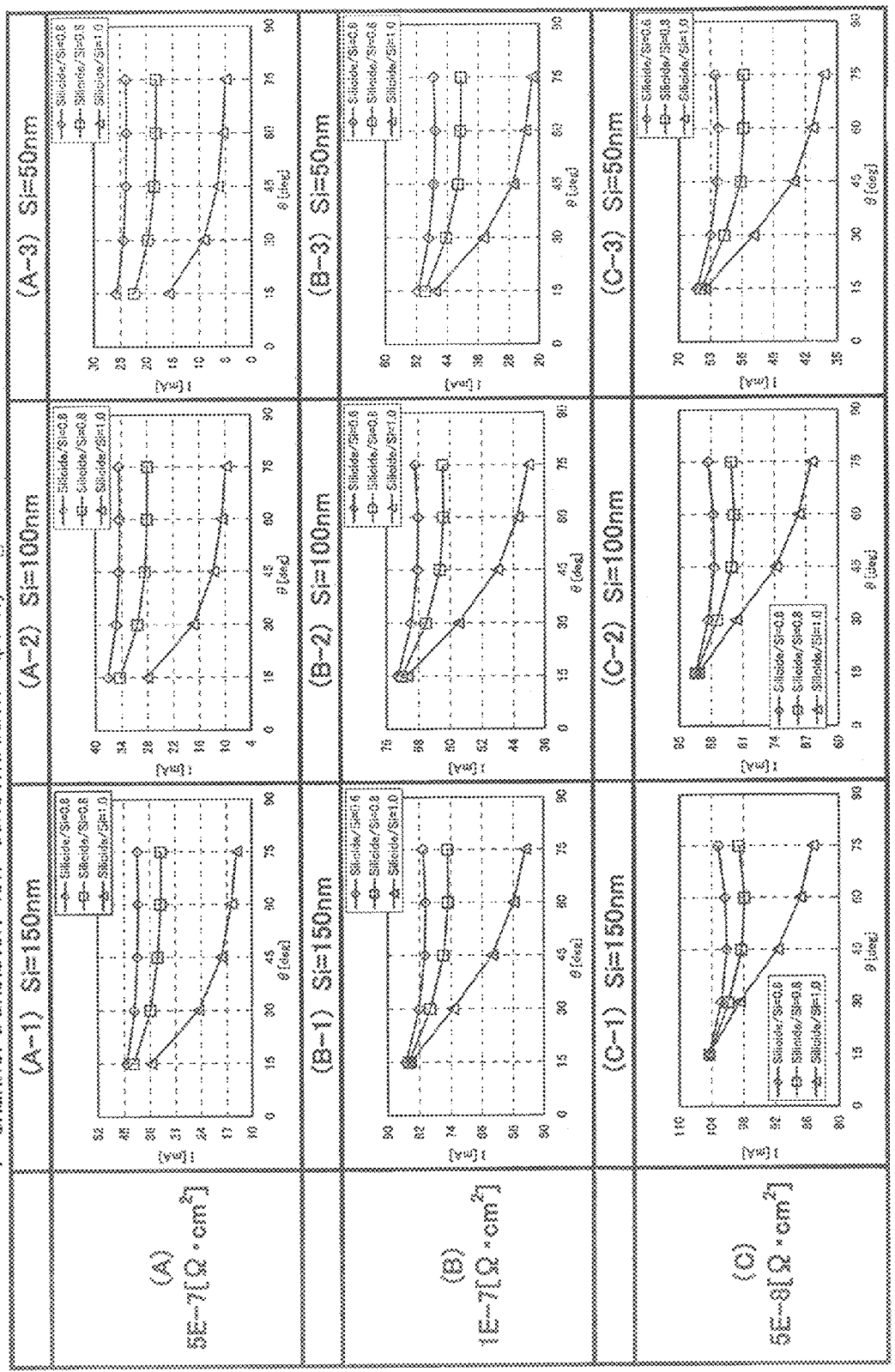
FIG. 13 shows evaluation results of P-channel transistors (Embodiment Mode 1)
Figure 14:
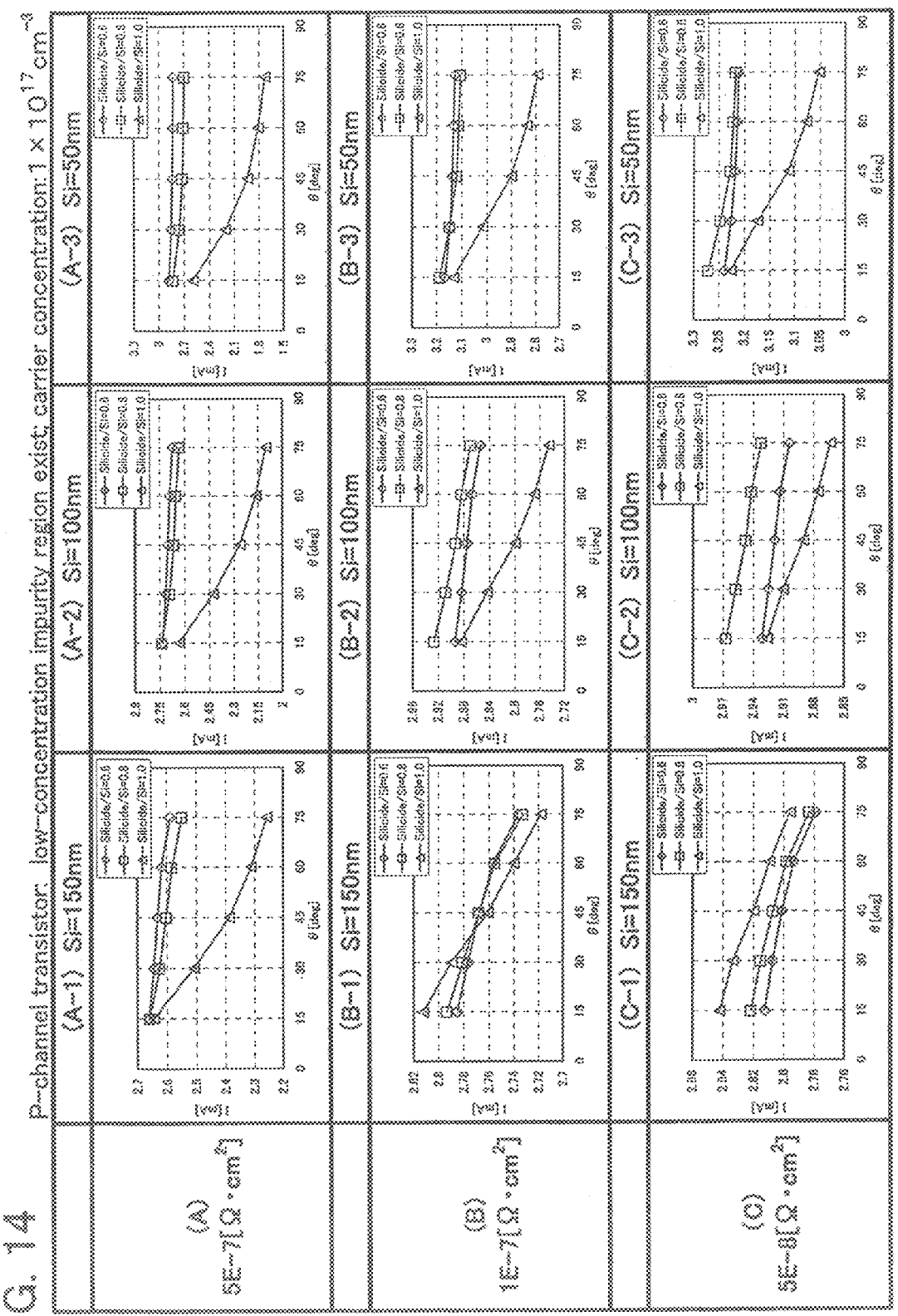
FIG. 14 shows evaluation results of P-channel transistors (Embodiment Mode 1)
Figure 15:
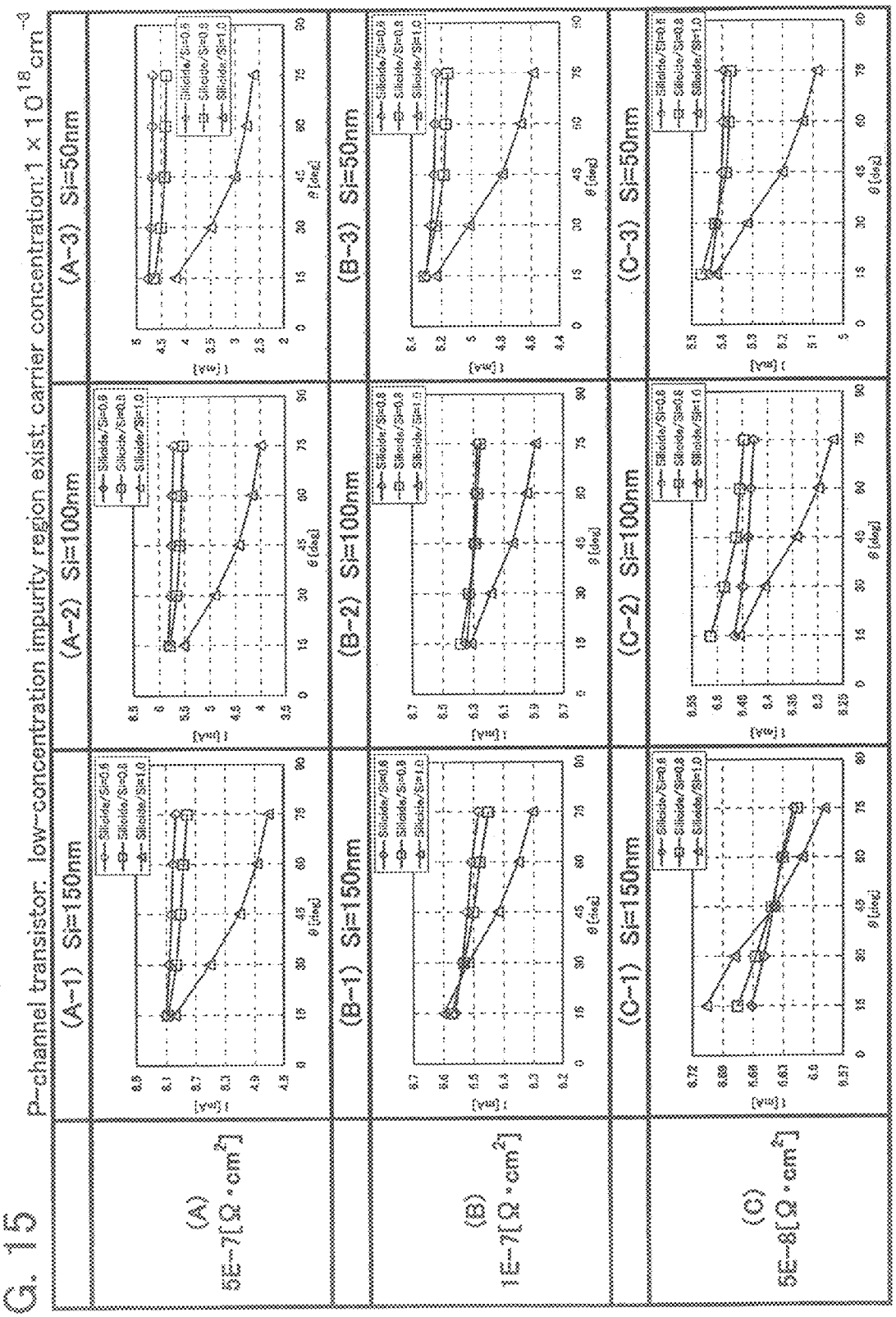
FIG. 15 shows evaluation results of P-channel transistors (Embodiment Mode 1)

FIGS. 10 to 15 show the same-style evaluation results as FIGS. 4 to 9, but the results only with a film-thickness ratio of 0.6 or more in each of the cases where the contact resistance Rc is $5\times10^{-7}$ $\Omega \cdot cm^2$, $1\times10^{-7}$ $\Omega \cdot cm^2$ and $5\times10^{-8}$ $\Omega \cdot cm^2$ are plotted separately by silicon film thicknesses. FIGS. 10 to 12 show the results of N-channel transistors, while FIGS. 13 to 15 show the results of P-channel transistors. FIGS. 10 and 13 each have the structure of FIG. 2A where a low-concentration impurity region does not exist between the region 31 and the silicide layer 33. FIGS. 11 and 14 each have the structure of FIG. 2B where the low-concentration impurity region 32b exists between the region 31 and the silicide layer 33, and show the results when the carrier concentration of the low-concentration impurity region 32b is $1\times10^{17}$ $cm^{-3}$. FIGS. 12 and 15 each have the structure including the low-concentration impurity region 32b of FIG. 2B, and show the results when the carrier concentration of the low-concentration impurity region 32b is $1\times10^{18}$ $cm^{-3}$.

In FIG. 10, the tendency in which an ON current is decreased as the angle θ is increased, can be observed. The decrease rate of the ON current is largely changed upon reaching an angle θ of 45°. Comparing the decrease rates of the ON current between the cases of the angle θ≤45° and the angle θ≥45°, the decrease rate of the ON current in the case of the angle θ≤45° is larger than that in the case of the angle θ≥45°. The result that the ON current is almost uniform in the case of the angle θ≥45° at the film-thickness ratios of 0.6 and 0.8, is also obtained.

In some conditions of FIG. 11, as the angle θ is increased, the ON current is decreased at the same rate from the angle θ of 15° to 75°. Meanwhile, in the rest of the conditions, the decrease rate of the ON current is largely changed upon reaching an angle θ of 45°. The decrease rate of the ON current in the case of the angle θ≤45° is larger than that in the case of the angle θ≥45°. At the film-thickness ratio of 0.6 in (A-3), (B-3), and (C-3) of FIG. 11, the ON currents are almost uniform in the case of the angle θ≥45°.

In some conditions of FIG. 12, similarly to FIG. 11, as the angle θ is increased, the ON current is decreased at the same rate from the angle θ of 15° to 75°. Meanwhile, in the rest of the conditions, the decrease rate of the ON current is largely changed upon reaching an angle θ of 45°. The decrease rate of the ON current in the case of the angle θ≤45° is larger than that in the case of the angle θ≥45°.

In every condition of FIG. 13, the decrease rate of the ON current is largely changed upon reaching an angle θ of 45°. The decrease rate of the ON current in the case of the angle θ≤45° is larger than that in the case of the angle θ≥45°. At the film-thickness ratios of 0.6 and 0.8, the ON current is almost uniform in the case of the angle θ≥45°.

In some conditions of FIG. 14, as the angle θ is increased, the ON current is decreased at the same rate from the angle θ of 15° to 75°. Meanwhile, in the rest of the conditions, the decrease rate of the ON current is largely changed upon reaching an angle θ of 45°. The decrease rate of the ON current in the case of the angle θ≤45° is larger than that in the case of the angle θ≥45°. At the film-thickness ratios of 0.6 and 0.8 in (A-3) of FIG. 14, the ON current is almost uniform in the case of the angle θ≥45°.

In some conditions of FIG. 15, similarly to FIG. 14, as the angle θ is increased, the ON current is decreased at the same rate from the angle θ of 15° to 75°. Meanwhile, in the rest of the conditions, the decrease rate of the ON current is largely changed upon reaching an angle θ of 45°. The decrease rate of the ON current in the case of the angle θ≤45° is larger than that in the case of the angle θ≥45°. At the film-thickness ratios of 0.6 and 0.8 in (A-3) of FIG. 15, the ON current is almost uniform in the case of the angle θ≥45°.

From the above-described results of FIGS. 10 to 15 when the film-thickness ratio is 0.6 or more, it was found that the ON current was decreased commonly in all the conditions, as the angle θ was increased at least in the case where the angle θ was 45° or less (θ≠0).

Accordingly, it was found that when an angle θ of an edge portion of a silicide layer was set such that 0°<θ<45° with a film-thickness ratio of 0.6 or more where the ON current was decreased depending on the angle θ, a transistor with a higher ON current than that of a transistor with an angle θ≥45° could be obtained.

In a cross section of a silicide layer of an actual transistor, the thickness of the silicide layer is gradually increased from an edge on a channel formation region side and the silicide layer has a shape with curvature, as show in the photographs of FIGS. 3A and 3B. Therefore, the angle θ of the edge portion of the silicide layer is not uniform. That is, an interface between the silicide layer and an impurity region is expanded to the channel formation region side from the interface between the silicide layer and the impurity region, which is assumed by calculation and shown by a line forming an angle θ with a horizontal line.

Figure 1B:
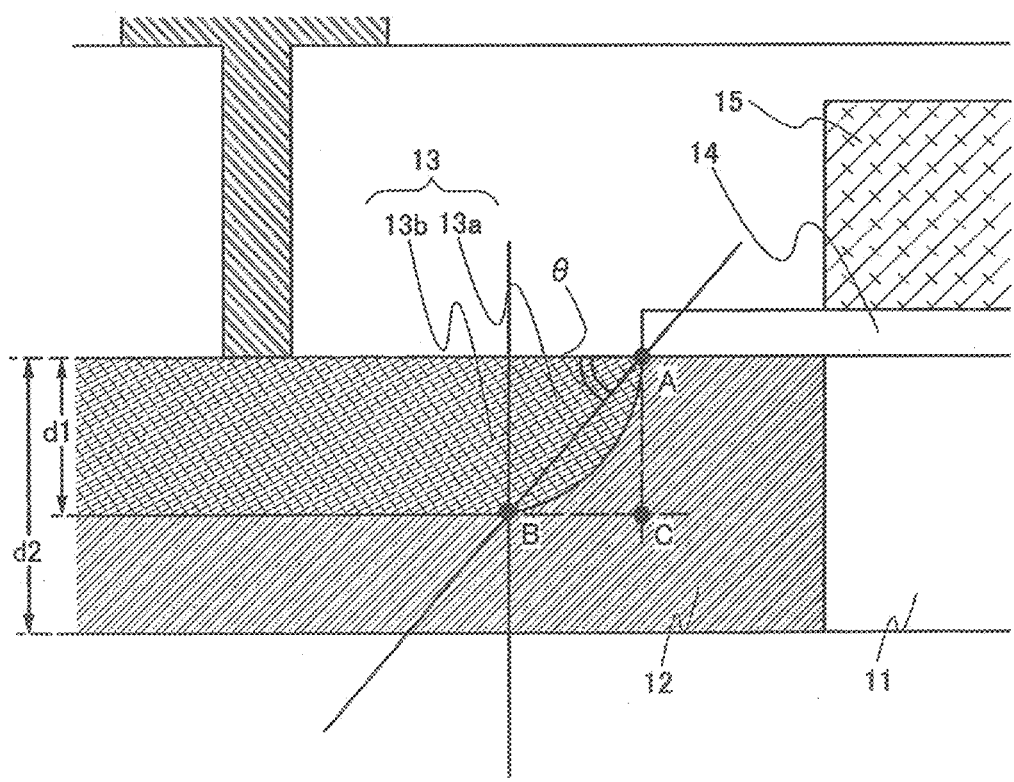

Accordingly, on applying the angle θ obtained by the above-described analysis to an actual transistor, it is preferable to consider as below. As shown in FIG. 1A and 1B, the first region 13a whose thickness is increased and the second region 13b whose thickness is more uniform than that of the first region 13a are separated by a straight line. The point where the straight line intersects with the interface between the silicide layer and the impurity region is referred to as the point B. At that time, it is preferable that a straight line passing through the edge A of the silicide layer 13 on the channel formation region side and the point B is a straight line which forms the angle θ with the horizontal line.

In FIG. 1B, when the angle θ is decreased with the thickness d1 of the silicide layer fixed, the point B shifts in a direction away from the region 11 along the interface between the silicide layer 13 and the impurity region 12. In other words, the length of the first region 13a in a channel length direction is increased gradually. Accordingly, making the angle θ in such that 0°<θ<45° means that the first region 13a of the silicide layer 13 is longer than that in the case of an angle θ≥45° in a channel length direction or that an area of the first region 13a is increased. Thus, a semiconductor device with a high ON current can be obtained.

Further, as shown in FIG. 1B, the point where the horizontal line passing through the point B intersects with a line which is perpendicular to the horizontal line and passes through the point A, is referred to as a point C. At that time, in order to obtain a semiconductor device with a high ON current, it is particularly effective if an area of a portion of the first region 13a, which is a portion outside the straight line which passes through the point A and the point B in the impurity region direction, is half or smaller than that of a triangle formed by the point A, point B and point C. In addition, the case where the impurity region 12 is formed beyond the straight line which passes through the point A and the point B in the first region 13a direction and has a hollow shape, may also be considered in the same manner. That is, in order to obtain a semiconductor device with a high ON current, it is particularly effective that the area of a portion of the impurity region, which is a portion outside the line which passes through the point A and the point B, is half or smaller than that of the triangle formed by the point A, point B and point C.

In addition, although it depends on a forming method of a transistor, in an actual transistor, there is a case where a semiconductor film has an ununiform thickness. In such a case, a film-thickness ratio may be calculated by using the silicon film thickness of a portion where the silicide layer is formed.

As described above, when the film-thickness ratio of a silicide layer to a silicon film thickness is 0.6 or more, a semiconductor device with a high ON current can be obtained by making the angle θ to be less than 45°(θ≠0°). Therefore, without providing a heat treatment step, it is possible to obtain a high ON current by controlling the angle θ of an edge portion of a silicide layer on a channel formation region side. In addition, since the number of manufacturing steps of a semiconductor device is not increased and a heat treatment apparatus is not required in order to obtain a high ON current, a transistor with a high characteristic can be manufactured with the maintained manufacturing cost. Further, a transistor with a high ON current and a suppressed sheet resistance can be obtained.

Note that ON currents flowing to the electrode 34 from the impurity region 32 or the high-concentration impurity region 32a serving as a source region, were calculated in the above-described analysis by the computer as shown in FIGS. 2A to 2C. Even when the impurity region 32 or the high-concentration impurity region 32a serves as a drain region, only the direction in which carriers flow changes so that the carriers flow from the electrode 34 to the impurity region 32 and the silicide layer 33. Thus, the impurity region 32 may serve as either a source region or a drain region. The shape of only the silicide layer which was provided in one side of the channel formation region was considered in the analysis by the computer. However, when the angle θ of 0°<θ<45° is applied to both silicide layers provided in both sides of the channel formation region, it is obvious that the ON current is further increased.

Embodiment Mode 2

A manufacturing method of a semiconductor device of the present invention will be described with reference to FIGS. 16A to 18B.

First, an insulating film 102 is formed with a thickness of 100 to 300 nm over a substrate 101. As the substrate 101, an insulating substrate such as a glass substrate, a quartz substrate, a plastic substrate or a ceramic substrate, a metal substrate, or the like can be used.

As the insulating film 102, a single-layer structure having an insulating film including oxygen or nitrogen such as silicon oxide (SiOx), silicon nitride (SiNx), silicon oxide including nitrogen (SiO$_x$N$_y$)(x>y) (also referred to as silicon oxynitride), or silicon nitride including oxygen (SiNxOy)(x>y) (also referred to as silicon nitride oxide), or a stack structure including the above-described film can be used. Although the insulating film 102 is not necessarily provided, the insulating film 102 is preferably formed in the case where contamination from the substrate is concerned.

The insulating film 102 which is in contact with a semiconductor film is preferably formed by using a silicon nitride film or a silicon nitride oxide film with a thickness of 0.01 to 10 μm, preferably 100 to 300 nm. In the case of using a crystallization method in which the semiconductor film is crystallized by being added with a metal element in a later crystallization step, it is necessary to getter the metal element. In such a case, if the insulating film is a silicon oxide film, in an interface between the silicon oxide film and a silicon film which is a semiconductor film, the metal element in the silicon film and oxygen in the silicon oxide film react with each other to be metal oxide, and the metal element may be difficult to be gettered. Thus, it is preferable that a silicon nitride film or a silicon nitride oxide film be used for a portion of the insulating film 102 which is in contact with the semiconductor film.

An island-like semiconductor film 103 is formed with a thickness of 10 to 150 nm over the insulating film 102. A material of the semiconductor film is a silicon film. The island-like semiconductor film 103 is formed as follows: a semiconductor film is formed over an entire surface of the insulating film 102 by a sputtering method, an LPCVD method, a plasma CVD method, or the like, and then, the shape of the semiconductor film is processed using a mask formed by photolithography or the like. When the island-like semiconductor film 103 is formed by using a crystalline semiconductor film, there are a method for forming a crystalline semiconductor film directly over the insulating film 102 and a method in which an amorphous semiconductor film is formed over the insulating film 102 and then crystallized by heat treatment to form a crystalline semiconductor film. In the latter method, the heat treatment in the crystallization is conducted by a heating furnace, laser irradiation, irradiation of light emitted from a lamp instead of laser light (hereinafter, referred to as lamp annealing), or a combination thereof.

In addition, the crystalline semiconductor film may be formed by a thermal crystallization method in which an amorphous semiconductor film is doped with nickel or the like and then the above heat treatment is conducted. It is to be noted that, in the case of obtaining the crystalline semiconductor film by crystallization using a thermal crystallization method with the use of nickel, gettering treatment by which nickel is removed is preferably conducted after the crystallization.

In the case of manufacturing the crystalline semiconductor film by crystallization with laser irradiation, a continuous-wave (CW) laser beam or a pulsed-wave (pulsed) laser beam can be used. As the laser beam that can be used here, a beam oscillated from one or more of: a gas laser such as an Ar laser, a Kr laser, or an excimer laser; a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal with a large grain size can be obtained by irradiation of a laser beam having a fundamental wave of such laser beams or one of second, third, and fourth harmonics of the laser beams. For instance, the second harmonic (532 nm) or the third harmonic (355 nm) of an Nd:YVO$_4$ laser (fundamental wave of 1,064 nm) can be used. This laser can be emitted with a CW or a pulsed wave.

In the case of emitting the laser with a CW, a laser power density of approximately 0.01 to 100 MW/cm$^2$ (preferably, 0.1 to 10 MW/cm$^2$) is required. The scanning rate is set to be approximately 10 to 2,000 cm/sec for the irradiation.

It is to be noted that a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser can be continuously oscillated. Further, pulse oscillation thereof can be performed with a repetition rate of 10 MHz or more by carrying out Q switch operation, mode synchronization, or the like. When a laser beam is oscillated with a repetition rate of 10 MHz or more, a semiconductor film is irradiated with a next pulse before the semiconductor film melted by the laser beam is solidified. Therefore, unlike the case of using a pulsed laser with a low repetition rate, a solid-liquid interface can be continuously moved in the semiconductor film so that a crystal grain, which continuously grows toward a scanning direction, can be obtained.

When ceramic (polycrystal) is used as a medium, the medium can be formed to have a free shape in a short time at low cost. When a single crystal is used, a columnar medium with several mm in diameter and several tens of mm in length is usually used. In the case of using the ceramic, a much larger medium can be formed.

Concentration of a dopant such as Nd or Yb in a medium, which directly contributes to light emission, cannot be changed largely in both cases of the single crystal and the polycrystal; therefore, there is a limitation to some extent in improvement in output of a laser by increasing the concentration. However, in the case of the ceramic, the size of a medium can be significantly increased as compared with the single crystal; therefore, drastic improvement in output of a laser can be expected.

Further, in the case of the ceramic, a medium with a parallelepipedon shape or a rectangular parallelepiped shape can be easily formed. In the case of using a medium having such a shape, when oscillated light is made to travel in a zigzag inside the medium, a long path of the oscillated light can be obtained. Therefore, amplitude is increased and a laser beam can be oscillated at high output. Furthermore, a cross-sectional shape of a laser beam, which is emitted from a medium having such a shape, is a quadrangular shape; therefore, as compared with a laser beam with a circular cross section, the laser beam with the quadrangular cross section has an advantage to be shaped into a linear beam. By shaping a laser beam emitted in the above-described manner using an optical system, a linear beam with a shorter side of 1 mm or less and a longer side of several mm to several m can be easily obtained. In addition, when a medium is uniformly irradiated with excitation light, a linear beam is emitted with a uniform energy distribution in a long side direction.

By irradiating the semiconductor film with such a linear beam, an entire surface of the semiconductor film can be more uniformly annealed. In the case where a linear beam that is uniform across its width needs to be irradiated, for example, both sides of the beam are provided with slits so as to intercept light of a portion where energy of the linear beam is attenuated.

When the semiconductor film is annealed using a linear beam with uniform intensity obtained in this manner and an electronic device is manufactured using the semiconductor film, a characteristic of the electronic device is favorable and uniform.

Then, if necessary, the semiconductor film is doped with a very small amount of impurity elements (boron or phosphorus) to control a threshold voltage of a transistor. Here, an ion doping method with plasma-excited diborane (B$_2$H$_6$) without mass separation is employed.

Next, a gate insulating film 104 with a thickness of 5 to 50 nm is formed so as to cover the island-like semiconductor film 103. The gate insulating film 104 may have a stack structure by appropriately using two or more of silicon oxide (SiOx), silicon nitride (SiNx), silicon oxide including nitrogen (SiOxNy) (x>y), silicon nitride including oxygen (SiNxOy) (x>y), and the like by a CVD method or a sputtering method. In this embodiment mod; the gate insulating film 104 has a stack structure including an SiNxOy film and an SiOxNy film.

Then, a conductive film to be a gate electrode is formed with a thickness of 200 to 550 nm over the gate insulating film 104. As the conductive film, aluminum (Al) film, a copper (Cu) film, a film containing aluminum or copper as its main component, a chromium (Cr) film, a tantalum (Ta) film, a tantalum nitride (TaN) film, a titanium (Ti) film, a tungsten (W) film, a molybdenum (Mo) film, a film containing tantalum as its main component, or the like can be used. In this embodiment mode, two-layered conductive film is used. As materials of the conductive film, a tantalum nitride film is formed as a first layer, and a tungsten film is formed as a second layer.

Figure 16A:
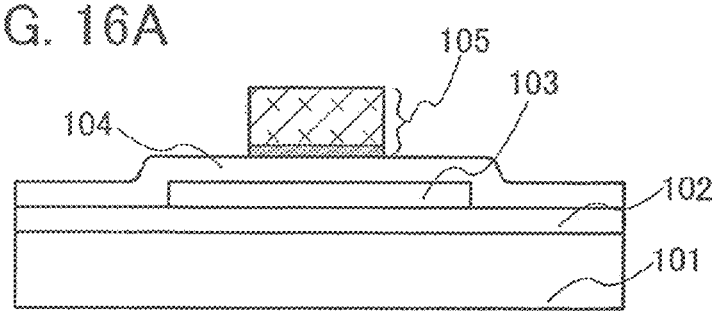
FIGS. 16A to 16D show a manufacturing method of a semiconductor device of the present invention (Embodiment Mode 2)

Then, a photomask is formed over the conductive film, and a gate electrode 105 with two-layered structure is formed by using photolithography (FIG. 16A). The gate electrode 105 may have a single layer or two or more layers.

Figure 16B:
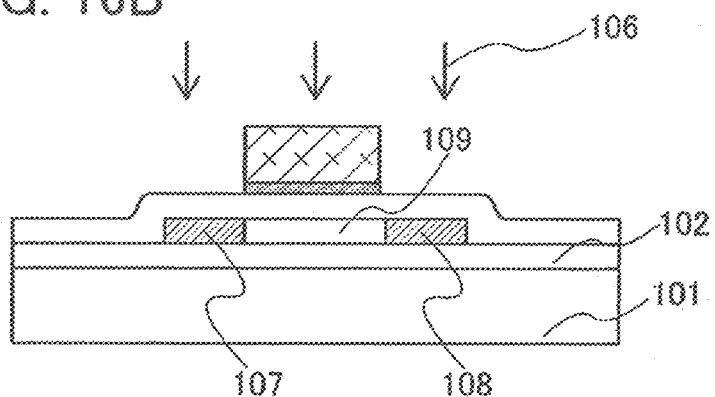

Next, the island-like semiconductor film 103 is doped with an impurity ion 106 at a high concentration (FIG. 16B). The impurity element passes through the gate insulating film 104 and the island-like semiconductor film 103 is doped with the impurity element, so as to form impurity regions 107 and 108 and a channel formation region 109. As a doping method, an ion doping method or an ion implantation method can be used. For example, in the case of manufacturing a P-type semiconductor, boron (B), gallium (Ga), or the like is used as an impurity element, and in the case of manufacturing an N-type semiconductor, phosphorus (P), arsenic (As), or the like is used.

Next, an insulating film is formed to cover the gate insulating film 104 and the gate electrode 105. The insulating film is formed, for example, by forming a film containing silicon oxide including nitrogen (SiOxNy) (x>y) with a thickness of 100 nm by a plasma CVD method and then forming a silicon oxide (SiO$_2$) film with a thickness of 200 nm by a CVD method.

Figure 16C:
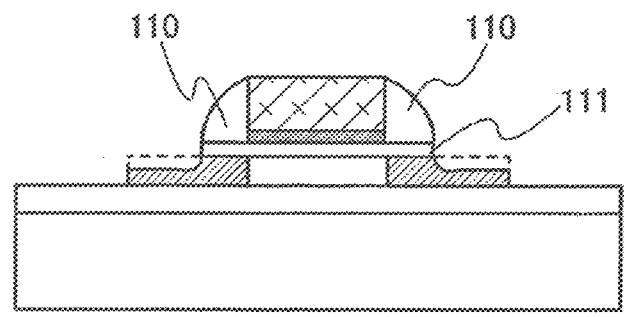

Then, the insulating film is selectively etched by anisotropic etching which mainly etch in the vertical direction, so as to form insulating layers (hereinafter referred to as sidewalls) 110 which are in contact with side surfaces of the gate electrode 105 (FIG. 16C). The sidewalls 110 are used as masks in forming silicide later. In addition, parts of the gate insulating film 104 are also removed by this etching to form a gate insulating film 111 so that parts of the semiconductor film are exposed. In the case where a selection ratio of the insulating film and the semiconductor film is low, the exposed parts of the semiconductor film are etched in some extent and the thicknesses thereof are reduced. In the case where the thickness of the semiconductor film is not uniform as shown in FIG. 16C, a film-thickness ratio of the semiconductor film to a silicide layer may be calculated by assuming the thickness of the exposed part of the island-like semiconductor as the thickness of the semiconductor film.

Figure 16D:
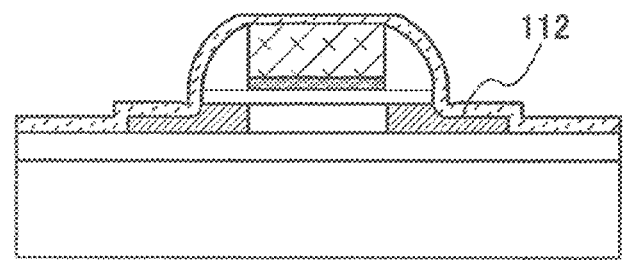

Next, a natural oxidation film formed on surfaces of the exposed parts of the semiconductor film is removed, and a metal film 112 is formed (FIG. 16D). The metal film 112 includes a material which forms silicide by reaction with the silicon film which is a semiconductor. As the metal film 112, for example, a nickel film, a titanium film, a cobalt film, a platinum film, a film including an alloy which includes at least two kinds of the above-described elements, or the like can be used. In this embodiment mode, a nickel film is formed as the metal film 112 at room temperature with a film formation power of 500 W to 1 kW by sputtering.

Figure 17A:
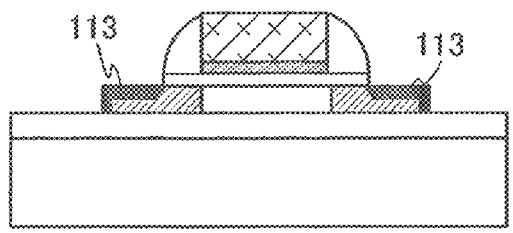
FIGS. 17A to 17D each show a manufacturing method of a semiconductor device of the present invention (Embodiment Mode 2)
Figure 17B:
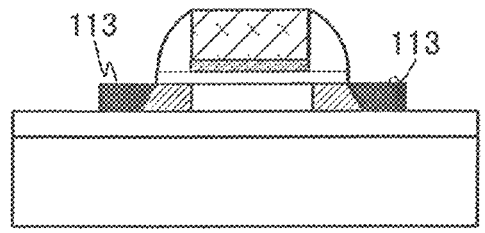

After forming the metal film 112, silicide layers 113 are formed by heat treatment (FIGS. 17A and 17B). The heat treatment can be conducted by RTA (Rapid Thermal Anneal), furnace anneal, or the like. In this embodiment mode, after forming the metal film 112, without exposing the metal film 112 to the atmosphere, RTA treatment is conducted with the condition of 600° C. and 30 seconds under reduced pressure or vacuum atmosphere, by which the high quality silicide layers 113 not influenced by an oxidation of the metal film 112 may be followed. Each of the silicide layers 113 has an edge in a portion which is on the channel formation region side and which corresponds to the edge portion of the gate insulating film 111. Each of the silicide layers 113 has a region in which the thickness is increased from the edge, a region in which the thickness is uniform, and a region which is formed along a side surface of the silicon film.

The thickness of each of the silicide layers 113 formed by this heat treatment can be controlled by controlling the thickness of the metal film 112 which is formed in FIG. 16D and the conditions of the heat treatment. In FIG. 17A, the silicide layers 113 are formed only on a surface of the island-like semiconductor film 103, while the silicide layers 113 are formed in an almost entire thickness of the island-like semiconductor film 103 in FIG. 17B, which is a structure called a full silicide. As the thickness of the metal film 112 is increased, the heat treatment temperature is increased, or the heat treatment time is increased, the thickness of the silicide layers 113 are increased so that the silicide layers 113 tend to have the full-silicide structure. That is, as the heat treatment time is increased and the thickness of the metal film 112 is thickened, the silicide layers 113 can be formed to be thick.

In addition, the length of the region, in which the thickness is increased, of each of the silicide layers 113 in a channel length direction can be controlled by the formation method of the metal film 112.

Figure 18A:
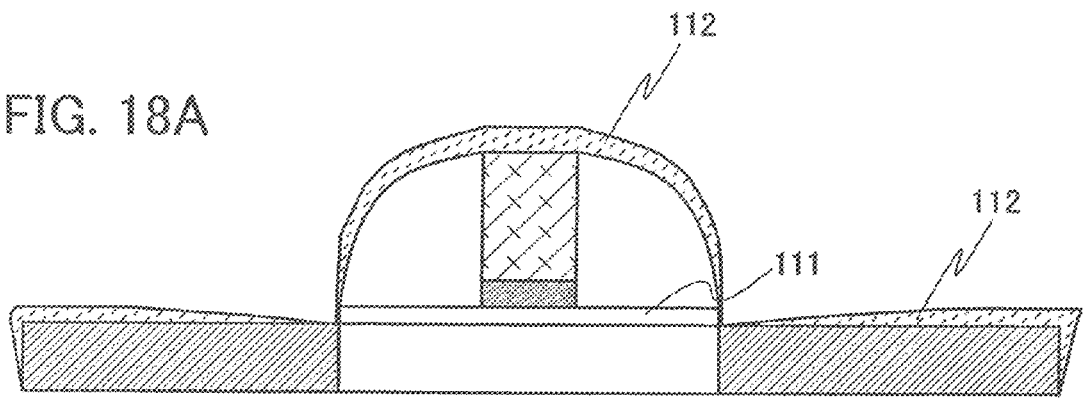
FIGS. 18A and 18B each show a manufacturing method of a semiconductor device of the present invention (Embodiment Mode 2)
Figure 18B:
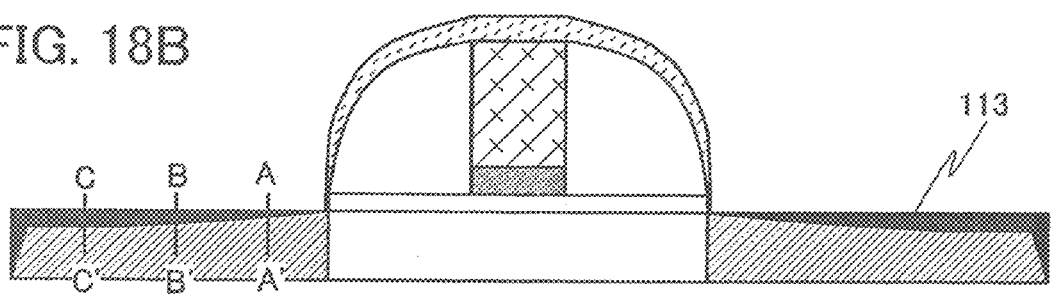

For example, as shown in FIG. 18A, the metal film 112 is formed with bad coverage, particularly on a side surface. The metal film 112 is the thinnest on a side surface of the gate insulating film 111, and the thickness of the metal film 112 is increased toward a top surface of the gate electrode and toward a side surface of the island-like semiconductor film 103. In FIG. 18B, heat treatment is conducted to form the silicide layers 113, after forming the metal film 112 with bad coverage. The thickness of each of the silicide layers 113 reflects the thickness of the metal film 112 and is also increased toward the side surface of the island-like semiconductor film 103 from the channel formation region side. That is, when the thickness of each of the silicide layers 113 is compared among portions of A-A', B-B', and C-C', the result is obtained that (A-A')<(B-B')<(C-C').

Accordingly, by controlling the degree of coverage of the metal film 112, the regions, in which the thickness is increased, of the edge portion on the channel formation region side of the silicide layers 113 can be increased in size. That is, the first region 13a of FIG. 1B can be extended in a channel length direction, and the angle θ in FIG. 1B can be decreased.

The coverage of the metal film 112 can be controlled by film formation conditions. If the metal film 112 is formed by sputtering, the shorter the distance between a semiconductor and a target is, the more the direction of sputtered atoms emitted from the target becomes irregular, so that the coverage of the metal film 112 becomes worse. In addition, the higher the atmospheric pressure in sputtering is, the more the track of the sputtered atoms to the semiconductor is fluctuated; accordingly, the coverage of the metal film 112 becomes worse. By controlling theses conditions, a silicide layer with an angle θ of 0°<θ<45° can be formed.

When the metal film 112 is formed to be thin with bad coverage, the thickness difference between a portion of the metal film 112 on the side surface of the gate insulating film 111 and a portion of the metal film 112 at an edge of the island-like semiconductor film 103 can be reduced. Accordingly, the length of the region in which the thickness is increased (the first region 13a of FIG. 1B) of each of the silicide layers 113 can be increased in a channel length direction, and the silicide layers 113 with a small angle θ can be formed.

As described above, by controlling the film formation conditions of the metal film 112 or the heat treatment conditions in forming the silicide layers 113, the thickness and shape of the silicide layers can be controlled. In this embodiment mode, the metal film 112 is formed so that the silicide layers 113 have the thicknesses which are 60% or more of the thickness of the island-like semiconductor film 103.

Next, a portion of the metal film 112, which has not reacted, is removed.

Figure 17C:
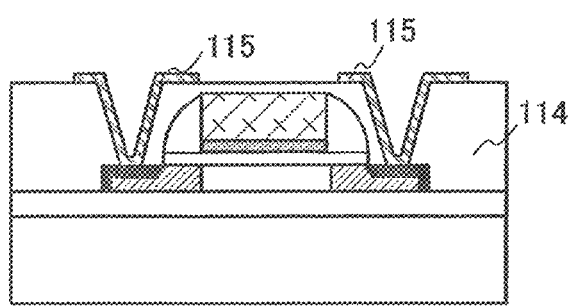

After that, an interlayer insulating film 114 is formed (FIG. 17C). The interlayer insulating film 114 is formed by using an organic material or an inorganic material. The interlayer insulating film 114 may have a single-layer structure or a stack structure. Contact holes for exposing the silicide layers 113 are formed in the interlayer insulating film 114 by etching. Then, a conductive layer is formed to fill the contact holes, and is etched so as to form wirings 115.

Figure 17D:
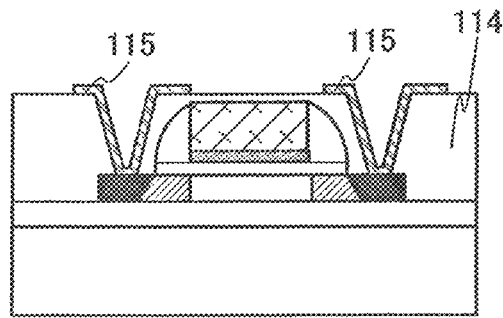

On the other hand, after an entire thickness of the semiconductor film becomes silicide as in FIG. 17B, an interlayer insulating film 114 is formed and wirings 115 are formed similarly to FIG. 17C so that the structure of FIG. 17D is obtained. In FIG. 17D, a source region and a drain region can be formed by using the silicide layers 113.

Note that either before forming the interlayer insulating film, or if the interlayer insulating film has a stack structure, after forming a first layer or a second layer, thermal activation of an impurity region may be carried out. The thermal activation can be conducted by using a method such as laser irradiation, RTA, or heat treatment using a furnace. Since the silicide is connected to the wirings in this structure, the thermal activation of the impurity region can be omitted.

The structure of FIG. 17C has a larger area in which the silicide layers 113 are in contact with the impurity regions 107 and 108, compared with the structure of FIG. 17D. Accordingly, contact resistance between the silicide layers 113 and the impurity regions 107 and 108 becomes low, so that parasitic resistance of FIG. 17C is lower than that of FIG. 17D.

On the other hand, in the structure of FIG. 17D compared with that of FIG. 17C, resistance of the source region and the drain region is low. The transistor formed in this embodiment mode corresponds to the structure of FIG. 2A which is assumed in the analysis by the computer, and the region 31 of FIG. 2A corresponds to the channel formation region 109. When the gate electrode 105 of this embodiment mode is formed to have a taper-shaped cross section and to have a shorter top side than a bottom side, edge portions of the bottom side of the gate electrode correspond to interfaces between the channel formation region 109 and the impurity regions 107 and 108.

Note that although the metal film 112 is formed after forming the sidewalls 110, the present invention is not limited to this. Instead of using the sidewalls, a mask may also be used.

In this embodiment mode, description has been made of the manufacture of a semiconductor device with a high ON current by controlling the shape and thickness of a pair of silicide layers 113 which are formed with a channel formation region interposed therebetween. However, in the present invention, the shape and thickness of the pair of silicide layers 113 are not necessarily controlled, as long as at least one of the silicide layers has a film-thickness ratio of 0.6 or more to a silicon film and has an angle θ of less than 45° (θ≠0°).

This embodiment mode describes a manufacturing method of a TFT. However, a transistor may be formed by forming an impurity region and a silicide layer over a silicon substrate or an SOI substrate. When the above-described manufacturing process of the transistor is applied to a silicon substrate or an SOI substrate, the forming steps of the gate insulating film 104 and the gate electrode 105 may be sequentially conducted after conducting element separation by using an isolation technique or the like.

This embodiment mode can be freely combined with Embodiment Mode 1.

Embodiment Mode 3

A manufacturing method of a semiconductor device including a low-concentration impurity region will be described with reference to FIGS. 19A to 20F. The same reference numerals are commonly given to the same components or components having the same function as those in Embodiment Mode 2, and the detailed explanation thereof will be omitted.

Figure 19A:
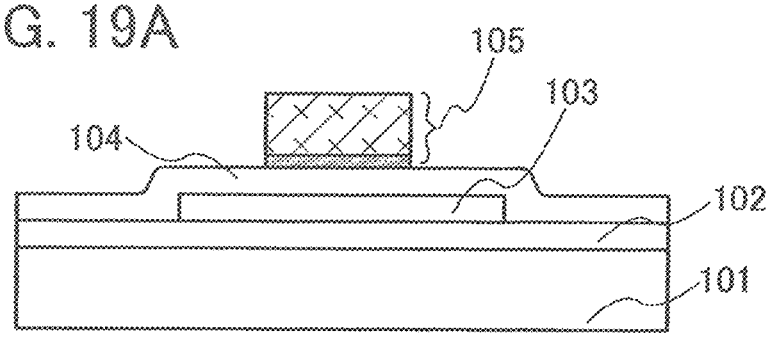
FIGS. 19A to 19D show a manufacturing method of a semiconductor device of the present invention (Embodiment Mode 3)
Figure 19B:
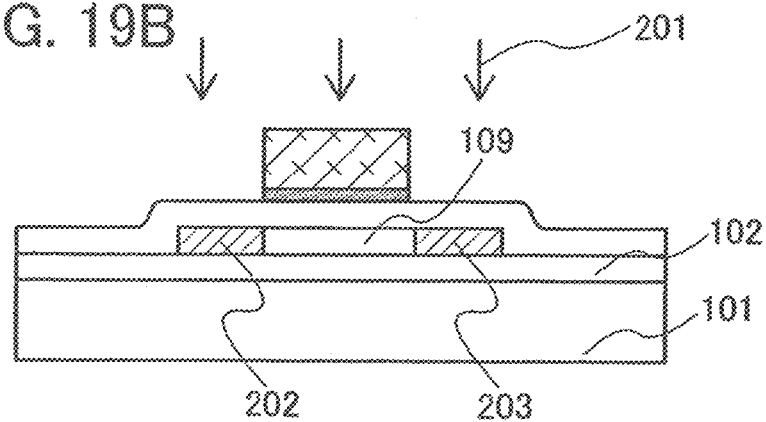

First, the process until the structure of FIG. 19A has been formed is the same as the process until the structure of FIG. 16A in Embodiment Mode 2 has been formed. Then, doping with an impurity ion 201 at a low concentration is conducted (FIG. 19B). The impurity ion 201 passes through the gate insulating film 104 to dope the island-like semiconductor film 103, to form low-concentration impurity regions 202 and 203 and a channel formation region 109. As a doping method, an ion doping method or an ion implantation method can be employed. For example, in the case of manufacturing a P-type semiconductor, boron (B), gallium (Ga), or the like is used as an impurity element, and in the case of manufacturing an N-type semiconductor, phosphorus (P), arsenic (As), or the like is used.

Figure 19C:
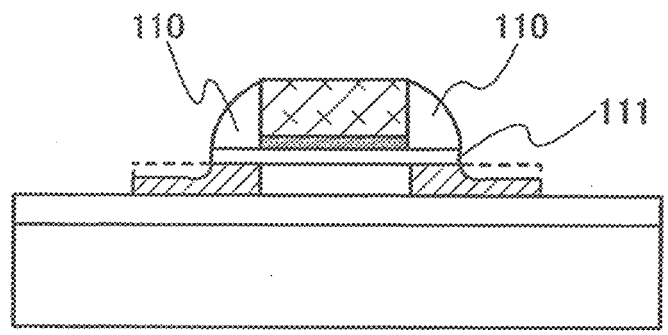

Next, sidewalls 110 are formed and a gate insulating film 111 is formed (FIG. 19C). This exposed parts of the semiconductor film later become a source region and a drain region. In the case where an etching selection ratio of the gate insulating film and the semiconductor film is low, the exposed part of the semiconductor film is etched in some extent and the thickness thereof is reduced.

Figure 19D:
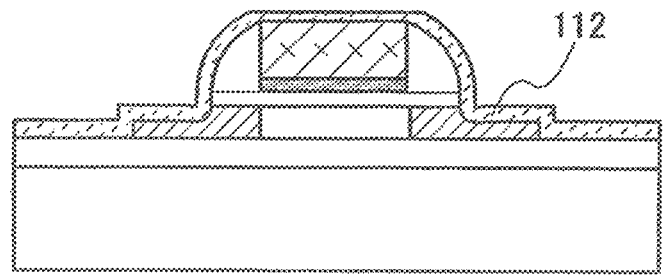
Figure 20A:
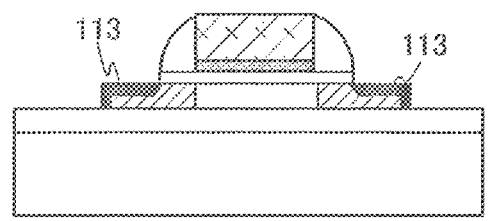
FIGS. 20A to 20F each show a manufacturing method of a semiconductor device of the present invention (Embodiment Mode 3)
Figure 20B:
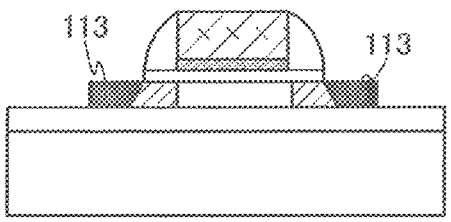

After that, a metal film 112 is formed by a similar method to that in Embodiment Mode 2 (FIG. 19D). Then, heat treatment is conducted to form silicide layers 113 as shown in FIG. 20A or 20B. The thicknesses and shapes of the silicide layers 113 are controlled by a method described in Embodiment Mode 2, and the silicide layers are formed so that the film-thickness ratio of the silicide layers to the silicon film is 0.6 or more and the angle θ is more than 0° and less than 45°.

Figure 20C:
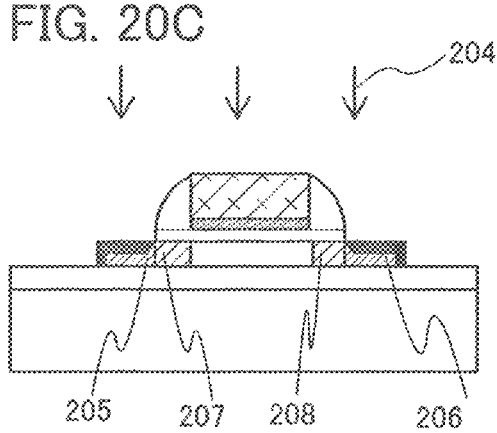
Figure 20D:
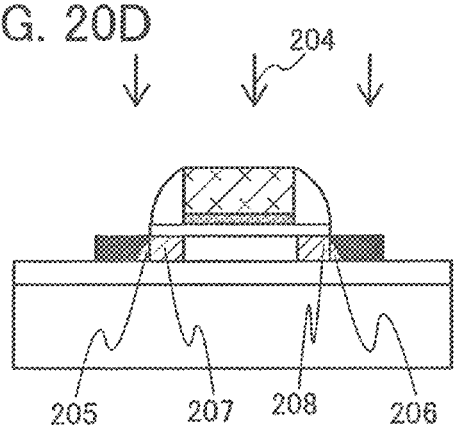

Next, doping with an impurity ion 204 at a high concentration is conducted by using the gate electrode 105 and the sidewalls 110 as masks (FIGS. 20C and 20D). High-concentration impurity regions 205 and 206 are formed in the island-like semiconductor film 103. With this formation, low-concentration impurity regions 207 and 208 are formed. For example, in the case of manufacturing a P-type semiconductor, boron (B), gallium (Ga), or the like is used as an impurity element, and in the case of manufacturing an N-type semiconductor, phosphorus (P), arsenic (As), or the like is used.

Figure 20E:
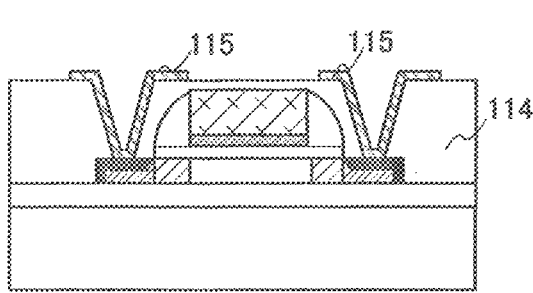
Figure 20F:
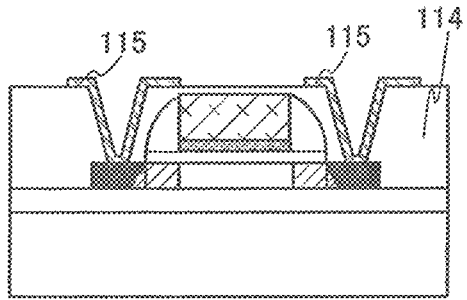

After forming the interlayer insulating film 114, etching is conducted to form wirings 115 which are connected to the silicide layers 113 (FIGS. 20E and 20F). In this embodiment mode, the low-concentration impurity regions 207 and 208 which are not overlapped with the gate electrode can be formed. A low-concentration impurity region which is not overlapped with a gate electrode is called a Loff region, and the Loff region has a high effect of suppressing an OFF current value. Thus, in manufacturing a semiconductor device in accordance with this embodiment mode, the semiconductor device can be formed with a high ON current and further with a low leakage current.

A transistor formed in this embodiment mode corresponds to the structure of FIG. 2B which is assumed in the analysis by the computer, and the region 31 of FIG. 2B corresponds to the channel formation region 109.

Note that either before forming the interlayer insulating film, or if the interlayer insulating film has a stack structure, after forming a first layer or a second layer, thermal activation of an impurity region may be carried out. The thermal activation can be carried out by using a method such as laser irradiation, RTA, or heat treatment using a furnace. Since the silicide is connected to the wirings in this structure, the thermal activation of the impurity region can be omitted.

In FIGS. 19A to 20F, doping with the impurity ion 204 at a high concentration is conducted after forming the silicide layers 113; however, silicide may be formed by forming the metal film 112 after the doping with the impurity ion 204. Since a full-silicide structure is formed in FIG. 20D, as long as an enough ohmic contact can be obtained, doping with the impurity ion 204 is not necessarily conducted.

In addition, although the metal film 112 is formed after forming the sidewalls, the present invention is not limited to this method. Instead of using the sidewalls, masks may be used.

This embodiment mode has described a manufacturing method of a TFT. However, a transistor may be formed by forming an impurity region and a silicide layer over a silicon substrate or an SOI substrate. When the above-described manufacturing process of the transistor is applied to a silicon substrate or an SOI substrate, the forming steps of the gate insulating film 104 and the gate electrode 105 may be sequentially conducted after conducting element separation by using an isolation technique or the like.

This embodiment mode can be freely combined with Embodiment Mode 1 or 2 as long as practicable.

Embodiment Mode 4

A manufacturing method of a semiconductor device including a gate electrode having a stack structure in which a top layer and a bottom layer of a gate electrode has different widths will be described. In this embodiment mode also, the same reference numerals are commonly given to the same components or components having the same function as those in Embodiment Modes 1 to 3, and the detailed explanation thereof will be omitted.

First, an insulating film 102, an island-like semiconductor film 103, a gate insulating film 104 are formed over a substrate 101 in a similar manner to that in Embodiment Mode 1. Then, a first conductive film 301 to be a gate electrode, which is the first layer, and a second conductive film 302 which is the second layer are formed over the gate insulating film 104. Note that a combination of the first conductive film 301 and the second conductive film 302 has to be considered so that an etching ratio thereof can be obtained in etching. As the combination of the first conductive film and the second conductive film for obtaining an etching ratio, for example, Al and Ta, Al and Ti, TaN and W can be employed. In this embodiment mode, a tantalum nitride film and a tungsten film are used as the first conductive film 301 and the second conductive film 302, respectively.

Figure 21A:
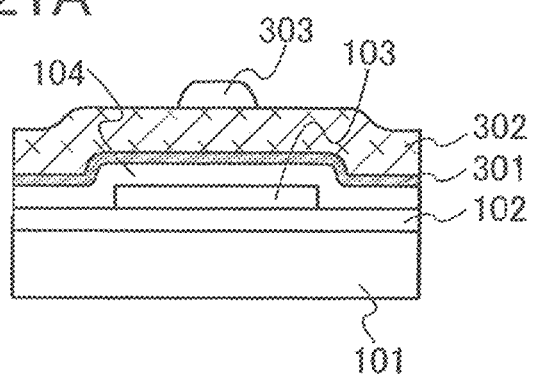
FIGS. 21A to 21D show a manufacturing method of a semiconductor device of the present invention (Embodiment Mode 4)

Then, a first resist 303 is formed over the second conductive film 302 (FIG. 21A).

Figure 21B:
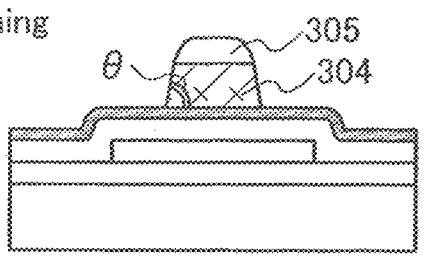

Then, a first etching is conducted by using the first resist 303 as a mask (FIG. 21B). In the first etching, the second conductive film. 302 is etched to form a conductive film 304. At this time, it is preferable to conduct etching under an etching condition of a high selection ratio with respect to the first conductive film 301 so as not to etch the first conductive film 301. It is to be noted that the first resist 303 is also etched to be a second resist 305. However, the receding width of the first resist 303 to the second resist 305 is not shown in the drawing. At this time, a side surface of the conductive film 304 has a taper angle θ of $80°\leq\theta\leq90°$, which is nearly a perpendicular taper angle.

In the first etching, a mixed gas of $Cl_2$, $SF_6$ and $O_2$ is used as an etching gas, and the flow rate is $Cl_2/SF_6/O_2$=33/33/10 sccm. Plasma is generated by applying power of 2000 W to a coil-shaped electrode at pressure of 0.67 Pa. Power of 50 W is applied to a substrate side (sample stage).

Figure 21C:
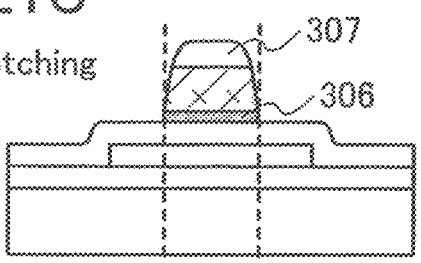

Next, a second etching is conducted to the first conductive film 301 by using the conductive film 304 as a mask (FIG. 21C). By the second etching, a first gate electrode 306 is formed from the first conductive film 301. At this time, it is preferable to conduct etching under an etching condition of a high selection ratio with respect to the gate insulating film 104 so as not to etch the gate insulating film 104. In the second etching condition, plasma is generated by applying power of 2000 W to a coil-shaped electrode at pressure of 0.67 Pa, and then, power of 50 W is applied to the substrate side (sample stage). An etching gas is $Cl_2$. It is to be noted that the second resist 305 is also etched and receded to be a third resist 307; however, the receded state is not shown in the drawing.

Figure 21D:
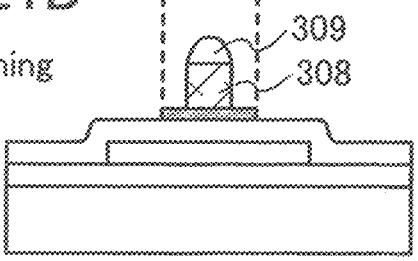

Then, a third etching is conducted (FIG. 21D). In the third etching condition, plasma is generated by applying power of 2000 W to a coil-shaped electrode at pressure of 1.33 Pa. Power is not applied to the substrate side (sample stage). An etching gas is a mixed gas of $Cl_2$, $SF_6$, and $O_2$, and the flow rate is $Cl_2/SF_6/O_2$=22/22/30 By the third etching, while the third resist 307 is receded, the length of the conductive film 304 in a channel length direction is also shortened by using the receded third resist 307 as a mask, and a second gate electrode 308 is formed. It is to be noted that the receded third resist 307 becomes a fourth resist 309. Thereafter, the fourth resist 309 is removed.

By the above-described process, a gate electrode having a stack structure in which the length of the first gate electrode 306, which is a bottom layer, in a channel length direction is longer than the length of the second gate electrode 308 which is a top layer. The gate electrode structure in this embodiment mode is formed by utilizing the resist receding width in etching. Specifically, the receding width from the third resist 307 to the fourth resist 309 in the third etching equals the length difference between the gate length of the first gate electrode and the length of the second gate electrode 308 in a channel length direction.

In this embodiment mode, the difference between the length of the first gate electrode 306 in a channel length direction and the length of the second gate electrode 308 in a channel length direction can be made to be 20 to 200 nm, and a considerably minute gate electrode structure can be formed.

The first to third etchings of this embodiment mode can be conducted by dry etching, and specifically, an ICP (Inductively Coupled Plasma) etching method can be used.

Figure 22A:
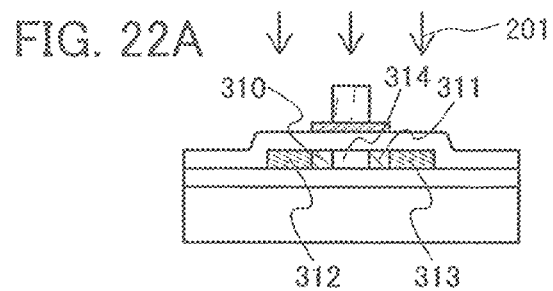
FIGS. 22A to 22I each show a manufacturing method of a semiconductor device of the present invention (Embodiment Mode 4)

Next, doping with an impurity ion 201 at a low concentration is conducted to the island-like semiconductor film 103 (FIG. 22A). The island-like semiconductor film 103 is doped with the impurity element at a low concentration through the first gate electrode 306 and the gate insulating film 104 to form low-concentration impurity regions 310 and 311 in a portion of the island-like semiconductor film, which is overlapped with the first gate electrode 306. In addition, at the same time, both end portions of the island-like semiconductor film are also doped with the impurity element only through the gate insulating film to form low-concentration impurity regions 312 and 313. A channel-formation region 314 is also formed. The element concentrations of the low-concentration impurity regions 310 to 313 are each $1\times10^{16}$ to $1\times10^{20}$ atoms/$cm^3$ (preferably, $1\times10^{16}$ to $5\times10^{18}$ atoms/$cm^3$). An ion doping method or an ion implantation method can be used as the doping method. For example, boron (B), gallium (Ga), or the like is used as the impurity element in manufacturing a P-type semiconductor, whereas phosphorus (P), arsenic (As), or the like is used in manufacturing an N-type semiconductor.

The doping to the low-concentration impurity regions 310 and 311 is conducted not only through the gate insulating film but also through the first gate electrode 306. Therefore, the concentration of the impurity element of the low-concentration impurity regions 310 and 311 is lower than that of the low-concentration impurity regions 312 and 313.

Figure 22B:
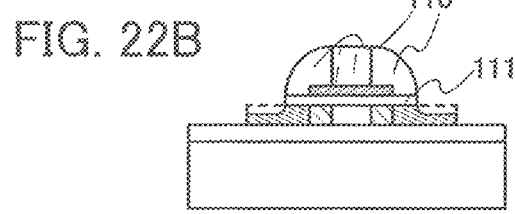

Next, an insulating film is formed to cover the gate insulating film 104, the first gate electrode 306 and the second gate electrode 308, and is etched so as to form sidewalls 110 which are in contact with side surfaces of the first gate electrode 306 and the second gate electrode 308 (FIG. 22B). The sidewalls 110 are used as masks in forming suicide later. In addition, by this etching, parts of the gate insulating film 104 are also removed to form a gate insulating film 111 and parts of the semiconductor film is exposed.

Figure 22C:
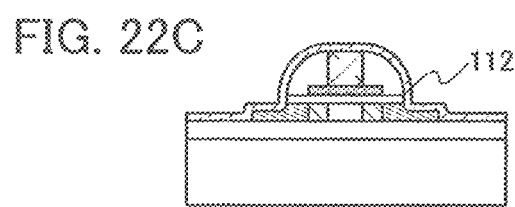

Next, after a natural oxidation film formed on surfaces of the exposed parts of the semiconductor film is removed, a metal film 112 is formed (FIG. 22C). The metal film 112 is formed by the method described in Embodiment Mode 2, and the shape and the thickness of silicide layers is controlled. Then, silicide layers 113 are formed by heat treatment.

The silicide layers 113 are nickel silicide here. As the heat treatment, RTA, furnace annealing, or the like can be used. At this time, by controlling a film thickness of the metal film 112, a heating temperature and a heating time, either structure of FIG. 22D or 22G can be obtained.

Then, nickel which has not reacted is removed. Here, nickel which has not reacted is removed by using an etchant composed of $HCl: HNO_3: H_2O$=3:2:1.

Figure 22D:
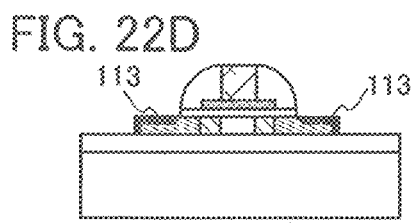

Heat treatment conditions for forming the silicide layers 113 are controlled so that the silicide layers 113 each have a film thickness that is equal to or less than that of the semiconductor film as shown in FIG. 22D. Alternatively, the thickness of the metal film 112 to be formed is controlled. Doping with an impurity ion 315 at a high concentration is conducted by using the sidewalls 110 as masks. By this doping, high-concentration impurity regions 318 and 319 are formed, which serve as a source region and a drain region. The high-concentration impurity regions 318 and 319 are doped with the impurity element so that the concentration is $1 \times 10^{19}$ to $1 \times 10^{21}$ atoms/cm$^3$. At the same time, low-concentration impurity regions 316 and 317 are formed. An ion doping method or an ion implantation method can be used as the doping method. Boron (B), gallium (Ga), or the like is used as the impurity element in manufacturing a P-type semiconductor, whereas phosphorus (P), arsenic (As), or the like is used in manufacturing an N-type semiconductor.

Figure 22G:
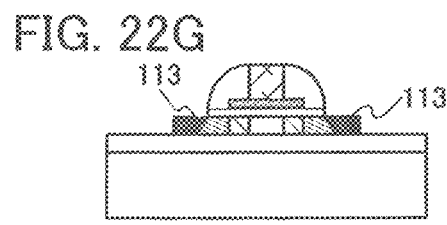
Figure 22E:
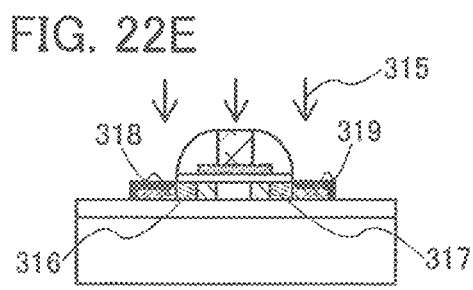
Figure 22H:
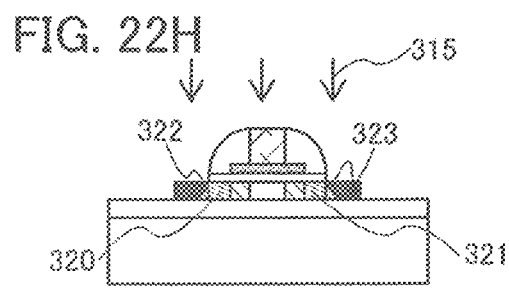
Figure 22F:
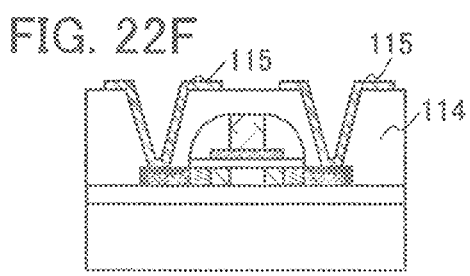

Then, an interlayer insulating film 114 is formed and wirings 115 are formed (FIG. 22F).

On the other hand, in FIG. 22G, silicide layers 113 are formed so that an entire film thickness of the semiconductor film becomes silicide. Then, doping with the impurity ion 315 at a high concentration is conducted by using the sidewalls 110 as masks, so that low-concentration impurity regions 320 and 321 and high-concentration impurity regions 322 and 323 are formed (FIG. 22H). Then, an interlayer insulating film 114 and wirings 115 are formed similarly to FIG. 22F, and the structure of FIG. 22I is formed.

In the structure of this embodiment mode in FIG. 22F, the high-concentration impurity regions 318 and 319 serve as a source region and a drain region. The low-concentration impurity regions 316 and 317, which are portions of the semiconductor film and are overlapped with bottom surfaces of the sidewalls formed on the side surfaces of the first gate electrode 306 through the gate insulating film 111 to become Loff regions. In addition, a low-concentration impurity region overlapped with a gate electrode is called a Lov region, and the low-concentration impurity regions 310 and 311 overlapped with the first gate electrode 306 through the gate insulating film 111 are Lov regions.

Figure 22I:
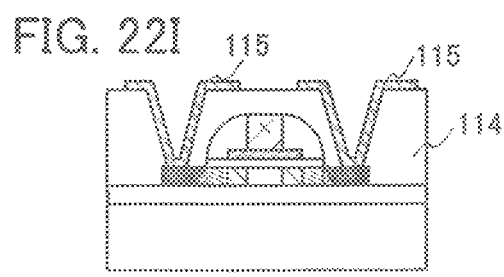

In FIG. 22I, the silicide layers 113 become a source region and a drain region. In addition, the low-concentration impurity regions 320 and 321 are Loff regions, and the low-concentration impurity regions 310 and 311 are Lov regions.

When the structure of FIG. 22F is compared with the structure of FIG. 22H, an area of a portion of the silicide layers 113, which is in contact with the high-concentration impurity regions 318 and 319, is larger. Therefore, contact resistance between the silicide layers 113 and the high-concentration impurity regions 318 and 319 is lower, and parasitic resistance is lower than the structure of FIG. 22I.

On the other hand, when the structure of FIG. 22I is compared with the structure of FIG. 22F, since the silicide layers 113 of FIG. 22I are thicker, sheet resistance of the impurity regions is lower.

In this embodiment mode, as well as deterioration in the ON current value can be prevented and high reliability can be realized, a structure with a high ON current can be formed. In addition, a minute TFT can be formed, in which the Lov length is 20 to 200 nm, the Loff length is 30 to 500 nm, and the channel length is 0.1 to 1.0 µm. Therefore, even in the case of an extremely minute TFT, a low-concentration impurity region suitable for its size can be formed, and a predetermined ON current can be obtained.

The transistor formed in this embodiment mode corresponds to the structure of FIG. 2B which is assumed in the analysis by the computer. The region 31 in FIG. 2B corresponds to the channel formation region 314 and the low-concentration impurity regions 310 and 311.

In FIGS. 22A to 22I, doping with the impurity ion 315 at a high concentration is conducted after forming the silicide layers 113; however, the metal film 112 may be provided to form silicide after doping with the impurity ion 315. Since a full-silicide structure is formed in FIG. 22H, as long as an enough ohmic contact can be obtained, doping with the impurity ion 315 is not necessarily conducted.

In addition, the metal film 112 is formed after forming the sidewalls here; however, the present invention is not limited to this method. A mask may be used instead of the sidewalls.

This embodiment mode has described a manufacturing method of a TFT. However, a transistor may be formed by forming an impurity region and a silicide layer over a silicon substrate or an SOI substrate. When the above-described manufacturing process of the transistor is applied to a silicon substrate or an SOI substrate, the forming steps of the gate insulating film 104, the first gate electrode 306 and a second gate electrode 308 may be sequentially conducted after conducting element separation by using an isolation technique or the like.

This embodiment mode can be freely combined with any one of Embodiment Modes 1 to 3 as long as practicable.

Embodiment Mode 5

In this embodiment mode, a manufacturing method of a semiconductor device will be described with reference to FIGS. 23A to 23G, which includes a gate electrode with a stack structure in which a top layer and a bottom layer of the gate electrode have different widths and includes only Lov regions. In this embodiment mode also, the same reference numerals are commonly given to the same components or components having the same function as those in Embodiment Modes 1 to 4, and the detailed explanation thereof will be omitted.

Figure 23A:
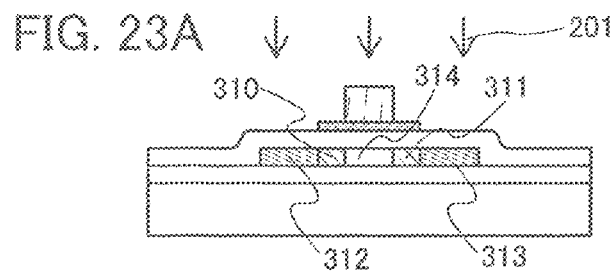
FIGS. 23A to 23G each show a manufacturing method of a semiconductor device of the present invention (Embodiment Mode 5)

In this embodiment mode, a semiconductor device is formed in a similar manner to FIGS. 21A to 21D in Embodiment Mode 4. Then, doping with an impurity ion 201 at a low concentration is conducted similarly to FIG. 22A to form low-concentration impurity regions 310 and 311, low-concentration impurity regions 312 and 313 and a channel formation region 314 (FIG. 23A).

Figure 23B:
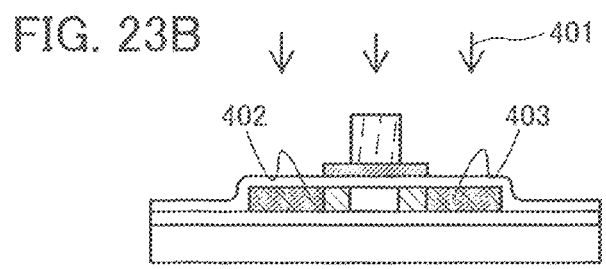

Next, doping with an impurity ion 401 at a high concentration is conducted by using a first gate electrode 306 as a mask so as to form high-concentration impurity regions 402 and 403 (FIG. 23B). Note that a state of FIG. 23B may be obtained by reversing the order of doping with the impurity ion 201 at a low concentration in FIG. 23A and doping with the impurity ion 401 at a high concentration in FIG. 23B. Alternatively, doping with the impurity ion 201 at a low concentration may be omitted, and only doping with the impurity ion 401 at a high concentration may be conducted. When the high-concentration impurity regions 402 and 403 are formed by doping with the impurity ion 401 at a high concentration, the low-concentration impurity regions 310 and 311 which are overlapped with the first gate electrode 306 are also doped with the impurity ion somewhat. By utilizing this phenomenon, without conducting the doping with the impurity ion 201, the low-concentration impurity regions 310 and 311 can also be formed by doping with only the impurity ion 401. For example, boron (B), gallium (Ga), or the like is used as the impurity element in manufacturing a P-type semiconductor, whereas phosphorus (P), arsenic (As), or the like is used in manufacturing an N-type semiconductor.

Figure 23C:
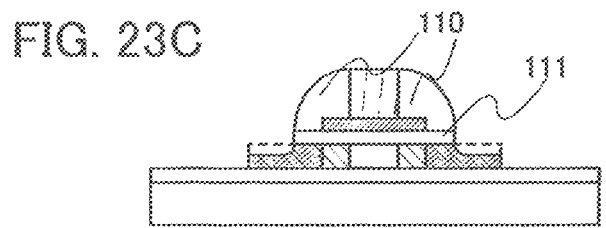

Next, sidewalls 110 are formed, and the gate insulating film is etched to newly form a gate insulating film 111 (FIG. 23C).

Figure 23D:
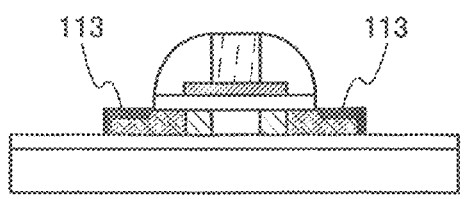
Figure 23F:
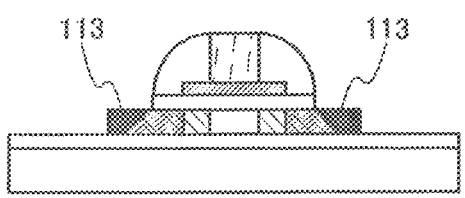
Figure 23E:
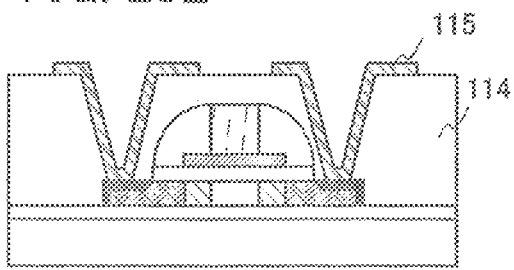
Figure 23G:
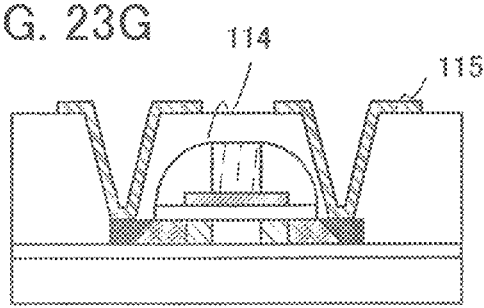

Then, a metal film is formed to cover the sidewalls 110 and an island-like semiconductor film 103, and heat treatment is conducted so as to form silicide layers 113. After forming the silicide layers 113 as shown in FIG. 23D or 23F, an interlayer insulating film 114 and wirings 115 are formed, and the structure of FIG. 23E or 23G is obtained.

The transistor formed in this embodiment mode corresponds to the structure of FIG. 2A which is assumed in the analysis by the computer. The region 31 in FIG. 2A corresponds to the channel formation region 314 and the low-concentration impurity regions 310 and 311.

Similarly to Embodiment Mode 1, a mask may be used instead of the sidewalls to form the structure of the transistor of this embodiment mode.

By the above-described process, a TFT including the low-concentration impurity regions 310 and 311 as Lov regions is completed. Since the TFT formed in this embodiment mode does not have a Loff region, the TFT can have a lower parasitic resistance and a higher ON current than that of the TFT in Embodiment Mode 4.

This embodiment mode has described a manufacturing method of a TFT. However, a transistor may be formed by forming an impurity region or a silicide layer over a silicon substrate or an SOI substrate. When the above-described manufacturing process of the transistor is applied to a silicon substrate or an SOI substrate, the forming steps of the gate insulating film 104, the first gate electrode 306 and a second gate electrode 308 may be sequentially conducted after conducting element separation by using an isolation technique or the like.

This embodiment mode can be freely combined with any of Embodiment Modes 1 to 4 as long as practicable.

Embodiment Mode 6

A structure of a semiconductor device of the present invention will be described with reference to FIGS. 24A to 26. The semiconductor device to be described in this embodiment mode is a DRAM (Dynamic Random Access Memory) used as a memory cell.

Figure 24A:
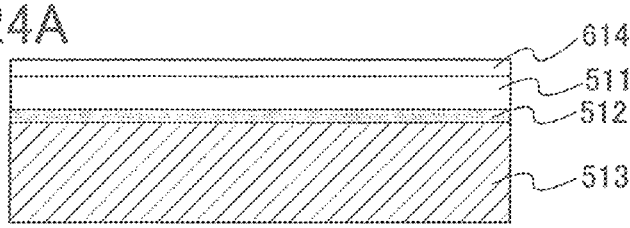
FIGS. 24A to 24F show a manufacturing method of a semiconductor device of the present invention (Embodiment Mode 6)

As shown in FIG. 24A, an inorganic insulating film 614 is formed over a SIMOX substrate which is a stack of a first single crystalline silicon layer 511, an insulating layer 512 and a second single crystalline semiconductor layer 513.

Figure 24B:
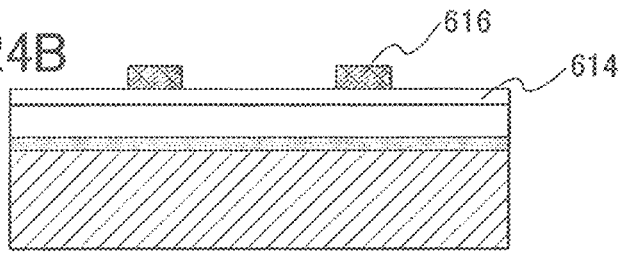

Then, gate electrodes 616 comprising a conductive material are formed. The gate electrode 616 may have a single layer or stacked layers. At this stage, a state of FIG. 24B is obtained.

Figure 24C:
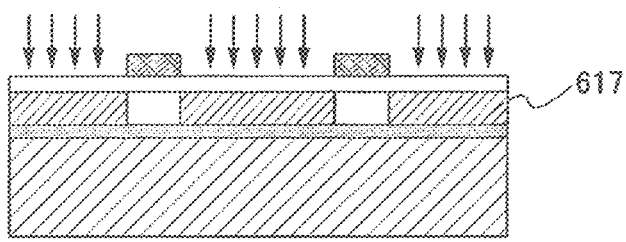

Next, in order to form a low-concentration impurity region, doping with an impurity at a low concentration is conducted by an ion doping method so that first impurity regions 617 are formed. At this stage, a state of FIG. 24C is obtained.

Figure 24D:
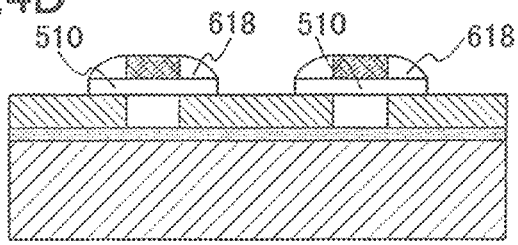

Next, a silicon nitride film is formed to cover the gate electrodes 616, and anisotropic dry etching is conducted. Thus, as shown in FIG. 24D, sidewalls 618 which are in contact with side surfaces of the gate electrodes 616 are formed. The inorganic insulating film 614 is etched by using the sidewalls 618 as masks so that gate insulating films 510 are formed.

Figure 24E:
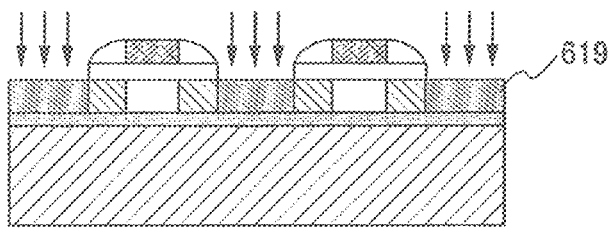

Then, in order to form high-concentration impurity regions serving as a source region and a drain region, doping with an impurity at a high concentration is conducted by an ion doping method so that second impurity regions 619 are formed. At this stage, a state of FIG. 24E is obtained.

Figure 24F:
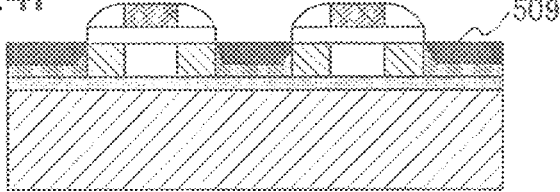

Next, a metal film for forming silicide layers by reaction with the first single crystalline silicon layer 511 is formed so as to cover the gate electrodes 616, the sidewalls 618, the second impurity regions 619 and the gate insulating films 510. As described in Embodiment Modes 1 to 5, the metal film is formed by controlling the film formation conditions to form silicide layers each having a shape of the present invention. Heat treatment is conducted to form silicide layers 509, and a portion of the metal film which has not reacted is removed (FIG. 24F).

Next, activation of the second impurity regions 619 is conducted. As this activation, laser anneal with an energy density of approximately 0.1 to 1 $J/cm^2$ is conducted by using a YAG laser or a XeCl laser. Instead of this laser anneal, laser anneal by using a laser beam which is a fundamental wave and has a pulse width of 10 ps or less can also be employed. Note that the activation step may also be omitted.

Next, as shown in FIG. 25, a first silicon oxide film 620 is formed by a CVD (Chemical Vapor Deposition) method and is planarized by CMP (Chemical Mechanical Polishing), and photolithography of contact holes is conducted. The contact holes formed by ethicng the first silicon oxide film 620 are filled with polysilicon, to form a leading terminal (also referred to as a plug) 621 which is in contact with the silicide layer 509. Plugs 624 and 625 for capacitors are formed at the same time.

Then, after a second silicon oxide film 622 is formed over an entire surface, a portion for forming a bit line is opened. Then, a titanium nitride film and a tungsten film are stacked by a sputtering method and patterned to form a bit line 623. The bit line 623 is shared by two memory cells.

After a third silicon oxide film 626 and a silicon nitride film 627 are formed over the bit line 623 by a CVD method, they are planarized by CMP, and contact holes are formed by photolithography. The contact holes formed by etching the third silicon oxide film 626 and the silicon nitride film 627 are filled with polysilicon, to form second plugs 628 and 629 for the capacitors, which are connected to the first plugs 624 and 625.

Thereafter, cylindrical capacitors are formed. First, lower electrodes of the capacitors are formed. A fourth silicon oxide film is formed by a CVD method with a thickness corresponding to the height of the capacitors to be formed. Holes for the lower electrodes of the capacitors are formed in the fourth silicon oxide film by photolithography. The holes for the lower electrodes of the capacitors are designed so that the capacitors are formed as large as possible, but so as not to be in contact with the adjacent capacitor.

Next, a thin polysilicon film is formed by a CVD method over the entire surface of the fourth silicon oxide film including an inner surface of the holes of the fourth silicon oxide film. Thereafter, the polysilicon film is selectively removed by etching-back to remove the polysilicon except in the holes of the fourth silicon film and to leave the polysilicon film only in the holes, thereby forming a plurality of cylindrical electrodes (lower electrodes of the capacitors) 630. Then, the fourth silicon oxide film is removed to expose peripheral portions of the lower electrodes 630.

In addition, the present invention is not limited to the structure of the memory cells shown in FIG. 25, and a planar type, a stacked type, or a trench type may be adopted, for example.

Next, a $Ta_2O_5$ film is formed, and a TiN film is formed by a CVD method. The TiN film is patterned to form upper electrodes (also referred to as plates) 631 made of the TiN film. The $Ta_2O_5$ film serves as a dielectric 637 of the capacitors. Through the above-described process, memory cells are completed. Further, $BaSrTiO_3$, $SiO_2$, $Si_3N_4$, or the like can be used as a substitute dielectric 637 for the $Ta_2O_5$ film.

After forming a first interlayer insulating film 632, first wirings 634 each including stack layers of a TiN film 634a and a film mainly containing Al 634b are formed. A second interlayer insulating film 633 is formed over the first wirings 634, and in addition, a second wiring 635 which includes stack layers of a TiN film 635a and a film mainly containing Al 635b is formed.

The memory cells are connected to a CMOS (Complementary Metal Oxide Semiconductor) circuit provided at the periphery of the memory cells, via the first wiring 634 and the second wiring 635. Note that as shown in FIG. 25, there is no connection of a wiring in the memory cells, and only the first and second wirings cross over a memory array where the memory cells are disposed. A wiring structure of three wirings of the bit line, the first wiring, and the second wiring is formed for the CMOS circuit that is provided at the periphery.

Annealing is conducted in a hydrogen atmosphere to recover damage. A protective film 636 such as, for example, a silicon oxide film or a silicon nitride film is formed. Although not shown here, an opening is formed to expose only a bonding pad (a terminal portion connected to a package) of the second wiring.

Lastly, the second single crystalline semiconductor layer 513 is removed by grinding. In this way, a DRAM, whose structure is partially shown in FIG. 25, is completed. Since memory cells including a transistor, whose silicide shape is optimized, can be manufactured in the above-described manner, memory cells in which reading can be conducted at high speed can be manufactured.

As a method for removing the second single crystalline semiconductor layer 513, a grinding polishing device such as a grind stone may be used. Alternatively, etchant may be used. Further alternatively, a combination of a grinding polishing device and etchant may be employed. Preferably, the second single crystalline semiconductor layer 513 is ground and polished until the second single crystalline semiconductor layer 513 is etched to a certain degree of thickness, and then is removed with etchant so as to expose the insulating layer 512. As the etchant, in the case of wet etching, a mixed solution in which hydrofluoric acid is diluted with water or ammonium fluoride; a mixed solution of hydrofluoric acid and nitric acid; a mixed solution of hydrofluoric acid, nitric acid, and acetic acid; a mixed solution of hydrogen peroxide and sulfuric acid; a mixed solution of hydrogen peroxide, ammonium water and water; a mixed solution of hydrogen peroxide, hydrochloric acid and water; or the like is used. In the case of dry etching, gas including molecules or atoms of halogen such as fluorine, or gas including oxygen is used. It is preferable to use gas or liquid including halogen fluoride or a halogen compound. For example, chlorine trifluoride ($ClF_3$) may be used as the gas including halogen fluoride.

Dicing is conducted to individually isolate chips each having a DRAM from a wafer. Then, the chips are picked up from the wafer one by one, and mounted on a lead frame 701 shown in FIG. 26. An electrode terminal of a chip 702 is electrically connected to an inner lead of the lead frame 701 by a gold wire 707 having a diameter of about 20 to 30 μm. Sealing is conducted using a mold resin layer 703 for easy handling. The lead is plated with a solder to prevent the element from rusting. Thereafter, the lead frame 701 is separated into individual packages to form leads. In this way, packaging is done.

Figure 26:
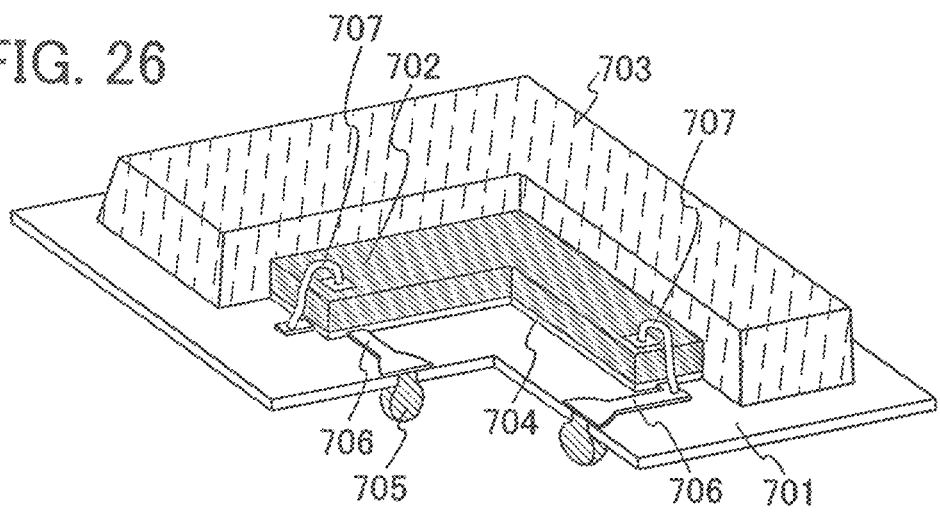
FIG. 26 is a perspective view of a semiconductor device of the present invention (Embodiment Mode 6)

FIG. 26 is a perspective view showing a cross-sectional structure of a packaged device. In the structure shown in FIG. 26, the chip 702 is connected to the lead frame 701 by a wire bonding method. In addition, the chip 702 is sealed with the mold resin layer 703. The chip 702 is mounted on the lead frame 701 by an adhesive agent 704 for mounting.

The lead frame 701 is a ball grid array type in which a solder ball 705 is provided. The solder ball 705 is formed on the opposite side of the lead frame 701, to the side provided with the chip 702. A wiring 706 provided on the lead frame 701 is electrically connected to the solder ball 705 via a contact hole provided in the lead frame.

In this embodiment mode, the wiring 706 for electrically connecting the chip 702 and the solder ball 705 is provided on the surface provided with the chip of the lead frame 701; however, the lead frame is not limited to this structure. For example, a multilayer wiring may be formed inside the lead frame.

In FIG. 26, the chip 702 and the wiring 706 are electrically connected to each other by the gold wire 707. A semiconductor element including a DRAM is provided for the chip 702, and a pad is provided on the opposite side of the chip 702, to the side provided with the lead frame 701. The pad is electrically connected to the semiconductor element. The pad is electrically connected to the wiring 706 provided on the lead frame 701, by the gold wire 707.

This embodiment mode can be freely combined with any of Embodiment Modes 1 to 5 as long as practicable.

Embodiment Mode 7

A configuration of a semiconductor device of the present invention will be described with reference to FIG. 27. A semiconductor device 1100 of the present invention includes an arithmetic processing circuit 1101, a memory circuit 1103, an antenna 1104, a power supply circuit 1109, a demodulation circuit 1110 and a modulation circuit 1111. The antenna 1104 and the power supply circuit 1109 are essential constituent elements for the semiconductor device 1100, and other elements are appropriately provided in accordance with uses of the semiconductor device 1100.

The arithmetic processing circuit 1101 analyzes a command, controls the memory circuit 1103, outputs data to be transmitted to the outside into the modulation circuit 1111, or the like, based on a signal inputted from the demodulation circuit 1110.

The memory circuit 1103 includes a circuit having a memory element and a control circuit for controlling writing and reading of data. The memory circuit 1103 stores at least an identification number of the semiconductor device itself. The identification number is used for distinguishing the semiconductor device from other semiconductor devices. In addition, the memory circuit 1103 includes one or plural kinds of an organic memory, a DRAM, an SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. Since the organic memory has a simple structure, a manufacturing process can be simplified and cost can be reduced. In addition, by the simple structure, an area of a stacked body can be easily reduced and high integration can be easily achieved. Moreover, there are also advantages that the organic memory is nonvolatile and does not require incorporation of a battery. Thus, it is preferable to use the organic memory as the memory circuit 1103.

The antenna 1104 converts a carrier wave supplied from a reader/writer 1112 into an alternating electrical signal. In addition, load modulation is applied from the modulation circuit 1111. The power supply circuit 1109 generates power supply voltage by using the alternating electrical signal converted by the antenna 1104 and supplies the power supply voltage to each circuit.

The demodulation circuit 1110 demodulates the alternating electrical signal converted by the antenna 1104 and supplies the demodulated signal into the arithmetic processing circuit 1101. The modulation circuit 1111 applies load modulation to the antenna 1104, based on a signal supplied from the arithmetic processing circuit 1101.

The reader/writer 1112 receives the load modulation applied to the antenna 1104, as a carrier wave. In addition, the reader/writer 1112 transmits the carrier wave to the semiconductor device 1100. Note that the carrier wave refers to an electromagnetic wave generated in the reader/writer 1112.

The various kinds of circuits included in the semiconductor device 1100 can be formed by using the transistors described in Embodiment Modes 1 to 5. In addition, the memory circuit 1103 may be formed by using a DRAM of Embodiment Mode 6. Accordingly, a semiconductor device with a high characteristic can be manufactured.

By utilizing the semiconductor device 1100 and the reader/writer 1112, data can be sent and received without contacting to each other. By fixing the semiconductor device 1100 to various objects by attachment or embedding, information of the objects can be read or written by the reader/writer 1112.

The various objects include, for example, keys (see FIG. 28A), bills, coins, securities, bearer bonds, certificates (a driver's license, a resident's card, or the like), books, packing containers (a petri dish or the like; see FIG. 28B), personal accessories and ornaments (a bag, glasses, or the like; see FIG. 28C), packing and wrapping containers (wrapping paper, a bottle, or the like; see FIG. 28D), recording media (a disk, a video tape, or the like), vehicles (a bicycle or the like), foods, clothing, key commodities, electronic devices (a liquid crystal display device, an EL display device, a television device, a portable terminal, or the like), and the like.

In addition, by utilizing the semiconductor device 1100 and the reader/writer 1112, a system can be constructed. The system refers to a physical distribution-inventory management system, a certification system, a distribution system, a production record system, a book management system, and the like. By utilizing the semiconductor device 1110 of the present invention, a system with high-speed reading and writing and with a high characteristic can be constructed.

For example, the semiconductor device 1110 of the present invention is provided inside an identification card, and a reader/writer 1112 is provided at an entrance of a building or the like (see FIG. 28E). The reader/writer 1112 reads an identification number inside the identification card that each person possesses and supplies information related to the identification number that has been read to a computer 1122. The computer 1122 determines whether to authorize the person's entrance or exit, based on the information supplied from the reader/writer 1112. Thus, by utilizing the semiconductor device of the present invention, an entrance-exit management system, in which convenience is improved, can be provided.

This embodiment mode can be freely combined with any one of Embodiment Modes 1 to 6 as long as practicable.

Embodiment Mode 8

Embodiment Mode 8 will describe a manufacturing example of a central processing unit (CPU) using the present invention. Here, a CPU is manufactured by using a transistor manufactured in accordance with Embodiment Mode 5. It is to be noted in this embodiment mode that the same reference numerals are commonly given to the same components or components having the same structure as that in Embodiment Modes 1 to 7, and the detailed description thereof will be omitted.

Figure 29:
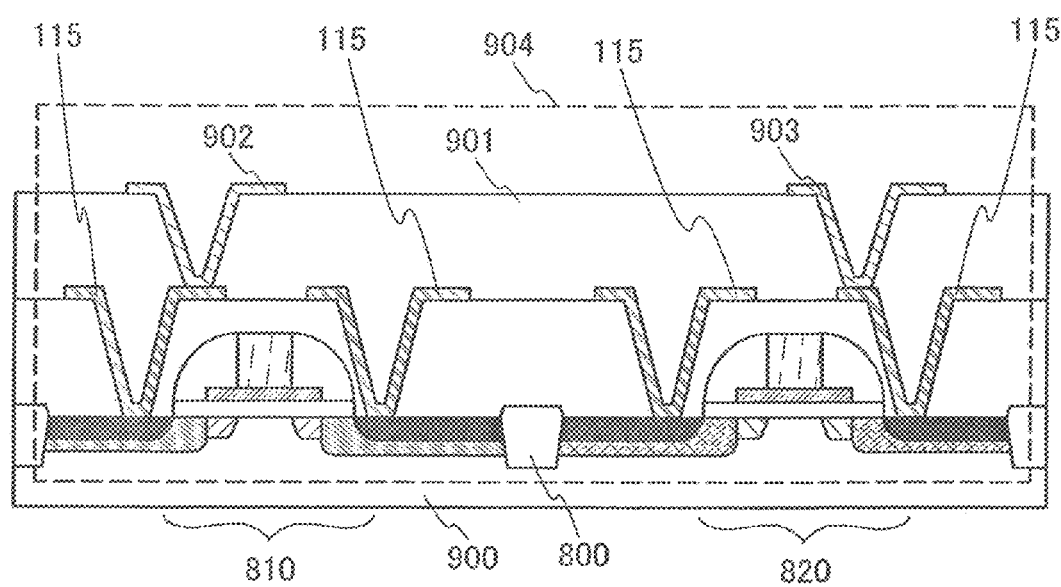
FIG. 29 shows a manufacturing method of a semiconductor device of the present invention (Embodiment Mode 8)

First, in accordance with the process described in Embodiment Mode 5, a P-channel transistor 820 and an N-channel transistor 810 each including Lov regions are formed over a silicon substrate 900 as shown in FIG. 29. The P-channel transistor 820 and the N-channel transistor 810 are separated by an element separation region 800. The element separation region 800 is formed by a known isolation technique such as a LOCOS method (selective oxidation) or an STI method (Shallow Trench Isolation), and according with this, an active layer is formed in the silicon substrate. Then, similarly to Embodiment Mode 5, a gate insulating film and a gate electrode are formed and ion doping or the like is conducted.

An insulating layer 901 is formed so as to cover the wirings 115 formed in Embodiment 5. The insulating layer 901 is formed by a single layer or stack layers by using an inorganic material or an organic material. The insulating layer 901 is a thin film formed to reduce projections and depressions due to a transistor for the purpose of planarization. Therefore, it is preferably formed by using an organic material.

Then, the insulating layer 901 is etched by photolithography to form contact holes which expose the wirings 115 serving as a source electrode and a drain electrode. Thereafter, a conductive layer is formed so that the contact holes are filled, and the shape of the conductive layer is processed to form conductive layers 902 and 903 serving as wirings or the like. The conductive layers 902 and 903 are formed by a single layer or stack layers including an element selected from aluminum (Al), titanium (Ti), silver (Ag) or copper (Cu), or an alloy material or compound material containing the element as its main component. For example, a three-layered structure including a barrier layer, an aluminum layer and a barrier layer in this order may be employed. The barrier layer corresponds to titanium, titanium nitride, molybdenum, molybdenum nitride, or the like.

An element group including a plurality of the n-channel transistors 810 and a plurality of the p-channel transistors 820, and a plurality of the conductive layers 902 and 903 serving as wirings or the like are collectively referred to as a thin film integrated circuit 904. Although not shown in the present process, a protective layer may be formed by a known method so as to cover the thin film integrated circuit 904. The protective layer may be a layer containing carbon such as DLC (Diamond Like Carbon), a layer containing silicon nitride, a layer containing silicon nitride oxide or the like.

A CPU can be manufactured by forming a plurality of the thin film integrated circuits 904 formed in the above-described manner over the same substrate.

However, the present invention is not limited to this transistor structure, and any structure of Embodiment Modes 1 to 5 can be applied to the N-channel transistors 810 and the P-channel transistors 820 in accordance with the uses. In addition, the present invention is not limited to a transistor which uses a silicon substrate, and the thin film integrated circuit 904 may be formed by using an SOI substrate and TFTs.

When the completed CPU is desired to be flexible or more lightweight, the silicon substrate 900 may be thinned by polishing.

Further, a specific configuration of the CPU of the present embodiment mode will be described with reference to a block diagram.

Figure 30:
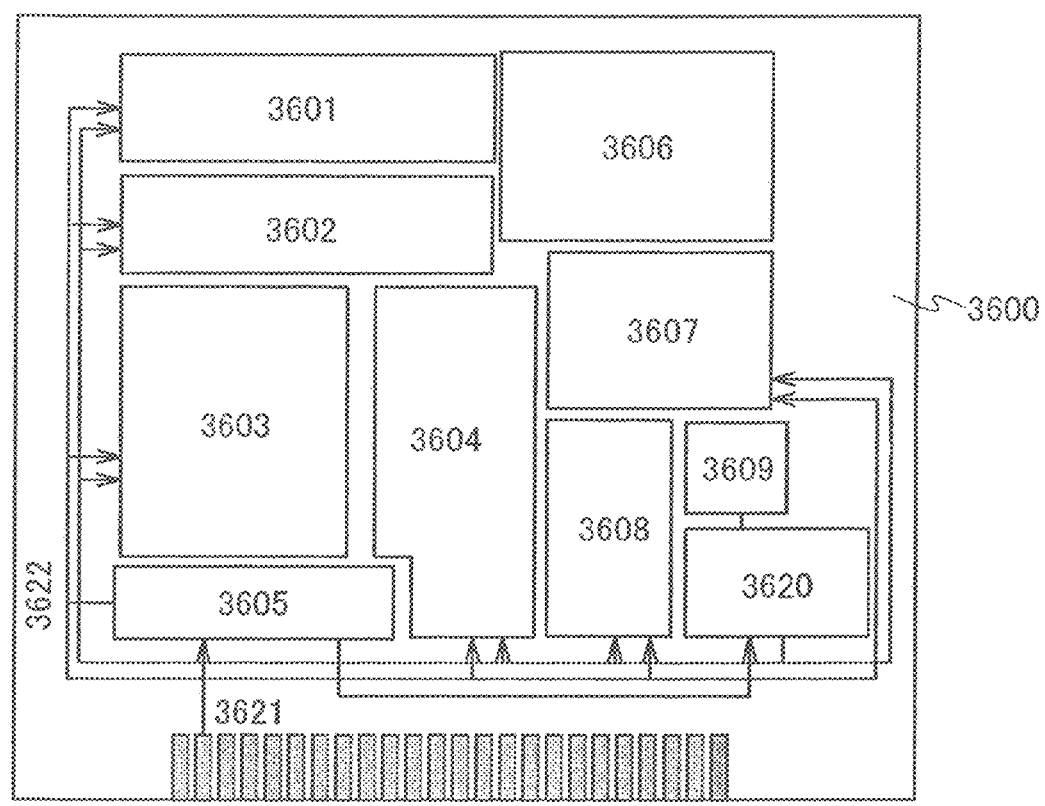
FIG. 30 is a block diagram of a semiconductor device of the present invention (Embodiment Mode 8)

A CPU shown in FIG. 30 mainly includes an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, a rewritable ROM 3609 and a ROM interface (ROM I/F) 3620, over a substrate 3600. The ROM 3609 and the ROM interface 3620 may be provided over another chip as well. These various circuits forming the CPU are formed by a plurality of thin film integrated circuits 904.

Obviously, the CPU shown in FIG. 30 is only an example in which the configuration is simplified, and an actual CPU may have various configurations depending on the uses.

An instruction inputted to the CPU through the bus interface 3608 is inputted to the instruction decoder 3603 and decoded therein, and then, inputted to the ALU controller 3602, the interrupt controller 3604, the register controller 3607 and the timing controller 3605.

The ALU controller 3602, the interrupt controller 3604, the register controller 3607 and the timing controller 3605 conduct various controls based on the decoded instruction. Specifically, the ALU controller 3602 generates signals for controlling the drive of the ALU 3601. While the CPU is executing a program, the interrupt controller 3604 judges an interrupt request from an external input/output device or a peripheral circuit based on its priority or a mask state, and processes the request. The register controller 3607 generates an address of the register 3606, and reads/writes data from/to the register 3606 in accordance with the state of the CPU.

The timing controller 3605 generates signals for controlling a drive timing of the ALU 3601, the ALU controller 3602, the instruction decoder 3603, the interrupt controller 3604, and the register controller 3607. For example, the timing controller 3605 is provided with an internal clock generator for generating an internal clock signal CLK2 (3622) based on a reference clock signal CLK1 (3621), and supplies the clock signal CLK2 to the various above circuits.

Figure 31A:
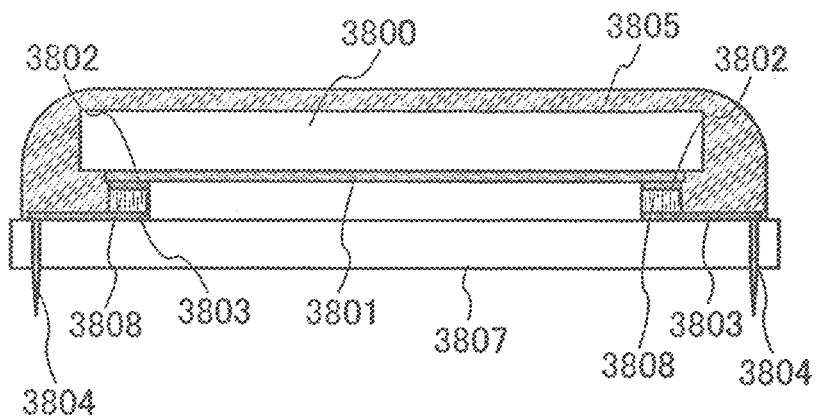
FIGS. 31A to 31C each show a semiconductor device of the present invention (Embodiment Mode 8).
Figure 31B:
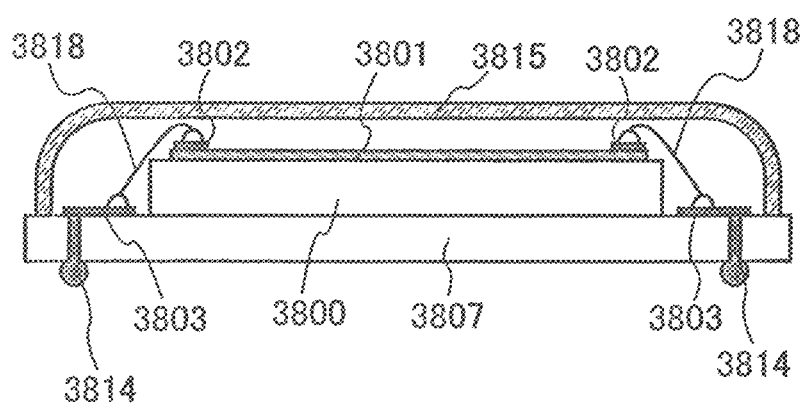
Figure 31C:
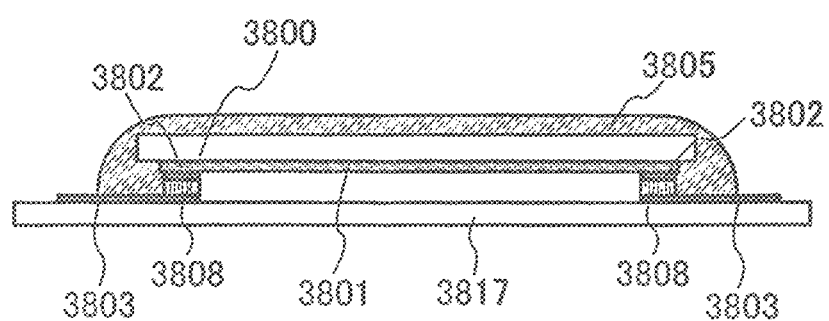

FIGS. 31A to 31C show a mode of a packaged CPU. A plurality of the thin film integrated circuits 904 are provided over a transistor array 3801.

In FIG. 31A, a CPU is packaged in a face-down position in which the transistor array 3801 having a CPU function formed over a substrate 3800 and electrodes (a source electrode and a drain electrode, or an electrode formed thereover with an insulating film interposed therebetween) 3802 provided over a surface of the CPU are disposed to face the bottom side. In addition, a wiring board provided with wirings 3803 which are formed of copper or an alloy thereof, for example a printed board 3807 is prepared. The printed board 3807 is provided with connection terminals (pins) 3804. The electrodes 3802 and the wirings 3803 are connected to each other with anisotropic conductive films 3808 or the like interposed therebetween. Thereafter, the CPU is covered with a resin 3805 such as an epoxy resin from an upper side of the substrate 3800, thereby completing a packaged CPU. Alternatively, the periphery of the CPU may be surrounded with a plastic or the like while keeping a hollow space without covering the CPU with the resin.

In FIG. 31B, unlike FIG. 31A, a CPU is packaged in a face-up position in which the electrodes 3802 formed over the surface of the CPU are provided to face the upper side. The substrate 3800 is fixed over the printed board 3807, and the electrodes 3802 and the wirings 3803 are connected to each other with wires 3818. Such connection using a wire is called wire bonding. The electrodes 3802 and bumps 3814 connected to the wirings 3803 are electrically connected to each other. Thereafter, the CPU is surrounded with a plastic 3815 or the like while keeping a hollow space, thereby completing a packaged CPU.

FIG. 31C shows an example in which the transistor array 3801 having a CPU function is fixed to a flexible substrate, for example an FPC (Flexible Printed Circuit) 3817. A CPU is packaged in a face-down position in which the transistor array 3801 having a CPU function formed over the substrate 3800 is provided so that the electrodes 3802 provided over the surface of the CPU are disposed to face the bottom side. In addition, the FPC 3817 having flexibility is provided with the wirings 3803 formed of copper or an alloy thereof. Then, the electrodes 3802 and the wirings 3803 are connected to each other with the anisotropic conductive films 3808 interposed therebetween. Thereafter, the resin 3805 such as an epoxy resin is formed so as to cover the substrate 3800, thereby completing a packaged CPU.

The CPU packaged in such a manner is protected from external environment so that it can be more easily carried about. In addition, the CPU can be mounted onto a desired position.

A CPU with high-speed arithmetic processing and high characteristics, which is an example of a semiconductor device of the present invention, can be manufactured.

This embodiment mode can be freely combined with any one of Embodiment Modes 1 to 7 as long as practicable.

This application is based on Japanese Patent Application serial no. 2005-349574 filed in Japan Patent Office on Dec. 2, 2005, the entire contents of which are hereby incorporated by reference.

What is claimed is:

1. A manufacturing method of a semiconductor device, comprising the steps of:
    forming a gate insulating film over a silicon film;
    forming a gate electrode over the gate insulating film;
    selectively exposing the silicon film by selectively removing the gate insulating film;
    forming a metal film in contact with a surface of the exposed silicon film so that a thickness of the metal film is thinnest on a side surface of the gate insulating film and continuously increased until reaching an outer side surface of the exposed silicon film; and
    forming a silicide layer in the silicon film by performing heat treatment on the metal film, wherein the silicide layer is formed so as to include a first region in which a thickness of the silicide layer is increased and a second region in which a thickness of the silicide layer is uniform.

2. The manufacturing method of a semiconductor device according to claim 1, wherein the heat treatment is conducted by a rapid thermal annealing.

3. The manufacturing method of a semiconductor device according to claim 1, wherein the heat treatment is conducted under reduced pressure or vacuum atmosphere.

4. The manufacturing method of a semiconductor device according to claim 1, wherein the silicon film is a crystalline silicon film.

5. The manufacturing method of a semiconductor device according to claim 1, wherein the silicide layer is formed so as to have an angle which is larger than 0° and smaller than 45° between an upper surface of the silicide layer and a first line which passes through an edge of the silicide layer and a point where a second line which perpendicularly crosses with the upper surface of the silicide layer and divides the silicide layer into the first region and the second region.

6. The manufacturing method of a semiconductor device according to claim 1, wherein a thickness of the second region to a thickness of the silicon film is 0.6 or more in ratio.

7. A manufacturing method of a semiconductor device, comprising the steps of:
    forming a silicon film over a substrate with an insulating layer interposed therebetween;
    forming an insulating film over the silicon film;
    forming a gate electrode over the insulating film;
    forming an impurity region in the silicon film by adding an impurity element;

selectively exposing the silicon film by selectively removing the insulating film;

forming a metal film in contact with a surface of the exposed silicon film so that a thickness of the metal film is thinnest on a side surface of the insulating film and continuously increased until reaching an outer side surface of the exposed silicon film; and forming a silicide layer in the silicon film by performing heat treatment on the metal film, wherein the silicide layer is formed so as to include a first region in which a thickness of the silicide layer is increased and a second region in which a thickness of the silicide layer is uniform.

8. The manufacturing method of a semiconductor device according to claim 7, wherein the heat treatment is conducted by a rapid thermal annealing.

9. The manufacturing method of a semiconductor device according to claim 7, wherein the heat treatment is conducted under reduced pressure or vacuum atmosphere.

10. The manufacturing method of a semiconductor device according to claim 7, wherein the silicon film is a crystalline silicon film.

11. The manufacturing method of a semiconductor device according to claim 7, wherein the silicide layer is formed so as to have an angle which is larger than 0° and smaller than 45° between an upper surface of the silicide layer and a first line which passes through an edge of the silicide layer and a point where a second line which perpendicularly crosses with the upper surface of the silicide layer and divides the silicide layer into the first region and the second region.

12. The manufacturing method of a semiconductor device according to claim 7, wherein a thickness of the second region to a thickness of the silicon film is 0.6 or more in ratio.

13. A manufacturing method of a semiconductor device, comprising the steps of:

forming an amorphous silicon film over a substrate with an insulating layer interposed therebetween;

crystallizing the amorphous silicon film to form a crystalline silicon film;

forming an insulating film over the crystalline silicon film;

forming an impurity region in the crystalline silicon film;

selectively exposing the crystalline silicon film by selectively removing the insulating film;

forming a metal film in contact with a surface of the exposed crystalline silicon film so that a thickness of the metal film is thinnest on a side surface of the insulating film and continuously increased until reaching an outer side surface of the exposed crystalline silicon film; and forming a silicide layer in the crystalline silicon film by performing heat treatment on the metal film, wherein the silicide layer is formed so as to include a first region in which a thickness of the silicide layer is increased and a second region in which a thickness of the silicide layer is uniform.

14. The manufacturing method of a semiconductor device according to claim 13, wherein the heat treatment is conducted by a rapid thermal annealing.

15. The manufacturing method of a semiconductor device according to claim 13, wherein the heat treatment is conducted under reduced pressure or vacuum atmosphere.

16. The manufacturing method of a semiconductor device according to claim 13, wherein the silicide layer is formed so as to have an angle which is larger than 0° and smaller than 45° between an upper surface of the silicide layer and a first line which passes through an edge of the silicide layer and a point where a second line which perpendicularly crosses with the upper surface of the silicide layer and divides the silicide layer into the first region and the second region.

17. The manufacturing method of a semiconductor device according to claim 13, wherein a thickness of the second region to a thickness of the crystalline silicon film is 0.6 or more in ratio.

* * * * *